(12) United States Patent
Otsuka

(10) Patent No.: US 6,992,945 B2
(45) Date of Patent: Jan. 31, 2006

(54) FUSE CIRCUIT

(75) Inventor: Nobuaki Otsuka, Komae (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

(21) Appl. No.: 10/692,951

(22) Filed: Oct. 27, 2003

(65) Prior Publication Data

US 2005/0041507 A1 Feb. 24, 2005

(30) Foreign Application Priority Data

Aug. 8, 2003 (JP) .............................. 2003-290861

(51) Int. Cl.
  *G11C 7/00* (2006.01)
(52) U.S. Cl. ...................... 365/225.7; 365/96; 327/525
(58) Field of Classification Search ...................... None
  See application file for complete search history.

(56) References Cited

U.S. PATENT DOCUMENTS

| | | | | |
|---|---|---|---|---|
| 5,668,818 A | * | 9/1997 | Bennett et al. ............. | 714/726 |
| 6,388,941 B2 | * | 5/2002 | Otori et al. ............ | 365/230.08 |
| 6,462,985 B2 | * | 10/2002 | Hosono et al. ........ | 365/185.09 |
| 6,542,419 B2 | * | 4/2003 | Hasegawa .................... | 365/200 |
| 6,747,481 B1 | * | 6/2004 | Pitts ............................ | 326/41 |
| 6,876,594 B2 | * | 4/2005 | Griesmer et al. ........ | 365/225.7 |
| 6,882,592 B2 | * | 4/2005 | Noguchi et al. ....... | 365/230.03 |

FOREIGN PATENT DOCUMENTS

JP 2002-76126 3/2002
JP 2002-368096 12/2002

OTHER PUBLICATIONS

U.S. Appl. No. 10/851,143, filed May 24, 2004, Otsuka et al.
U.S. Appl. No. 10/885,718, filed Jul. 8, 2004, Otsuka.

\* cited by examiner

Primary Examiner—Son Mai
(74) Attorney, Agent, or Firm—Oblon, Spivak, McClelland, Maier & Neustadt, P.C.

(57) ABSTRACT

One fuse set is constituted of a plurality of fuse blocks. Each of the blocks includes a sub-fuse set constituted of fuse elements electrically programmable, and a program control circuit which controls programming of the fuse elements. One of the fuse elements is an enable bit representing validity/invalidity of the sub-fuse set. One fuse block becoming an object of the programming is determined in accordance with a value of the enable bit.

19 Claims, 13 Drawing Sheets

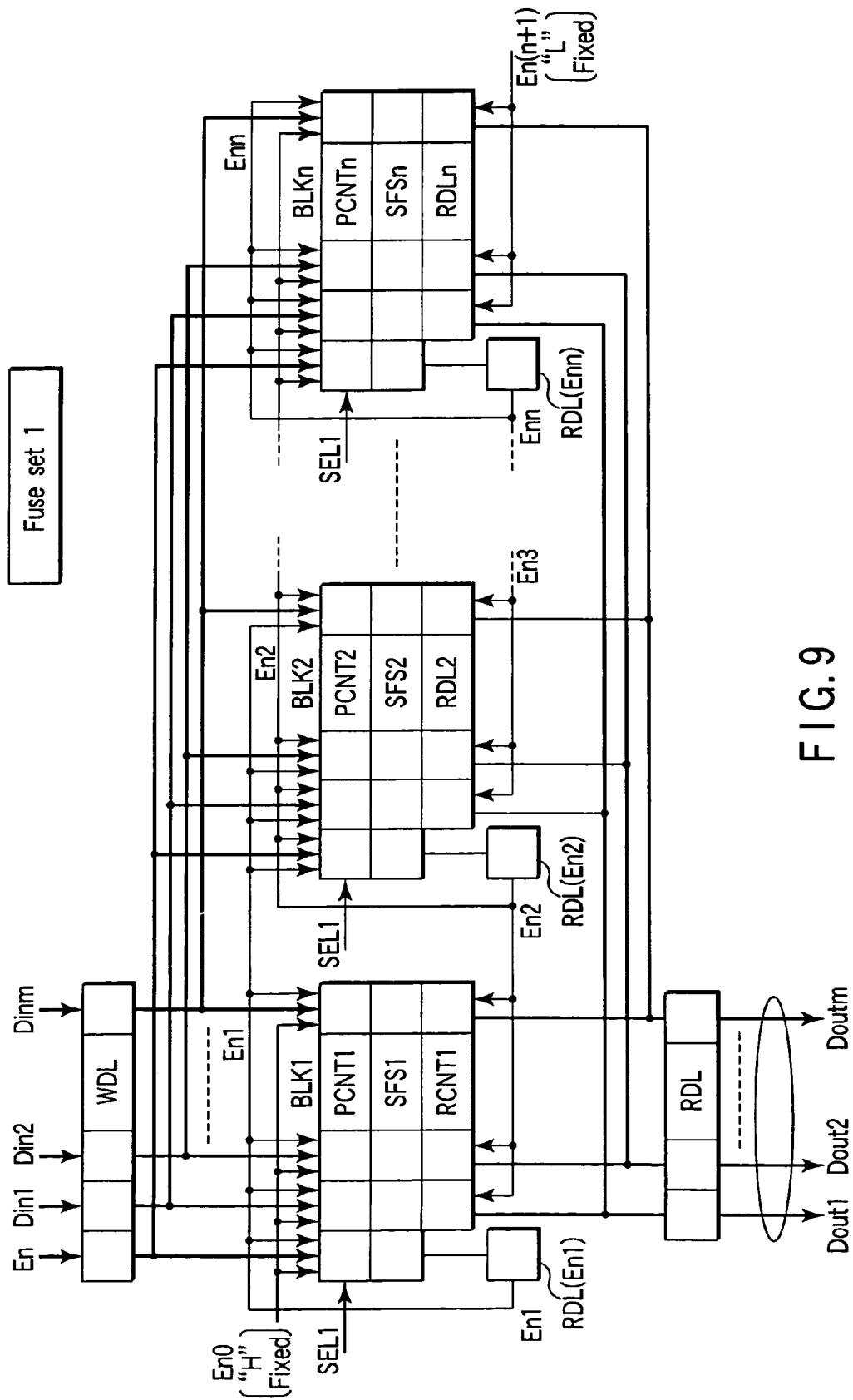
F I G. 9

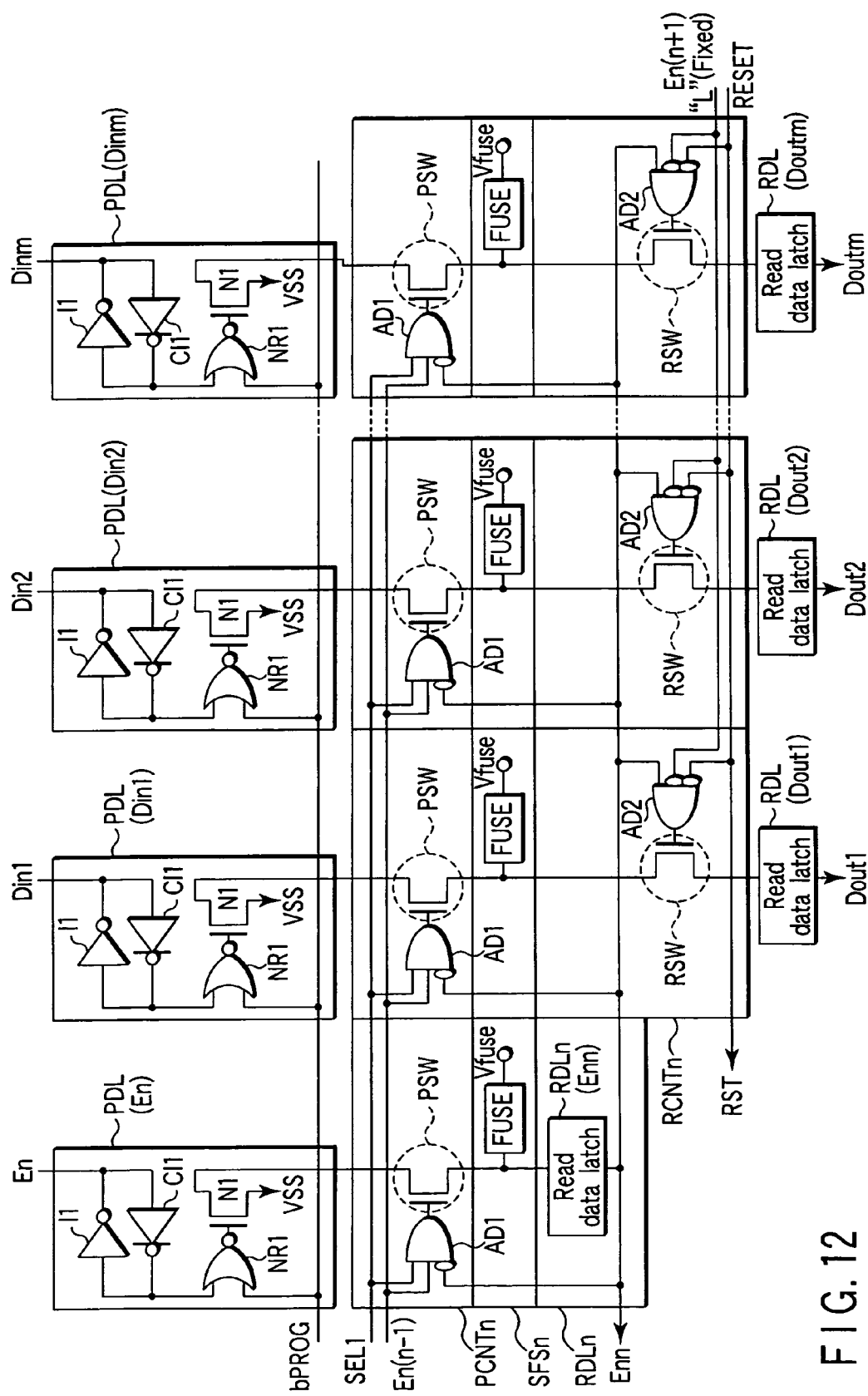
F I G. 12

F : Fuse circuit of the present invention

F : Fuse circuit of the present invention

FUSE CIRCUIT

CROSS-REFERENCE TO RELATED APPLICATIONS

This application is based upon and claims the benefit of priority from the prior Japanese Patent Application No. 2003-290861, filed Aug. 8, 2003, the entire contents of which are incorporated herein by reference.

BACKGROUND OF THE INVENTION

1. Field of the Invention

The invention relates to a read/program control circuit for electrically programmable fuse elements that can be formed by standard CMOS processing. More specifically, the invention is used in a fuse circuit configured of, for example, electrical-fuse elements and anti-fuse elements.

2. Description of the Related Art

Conventionally, when non-volatilely storing data in a semiconductor integrated circuit, memory elements need to be disposed in the semiconductor integrated circuit.

For example, when the size of data to be stored is very large and large-size data needs to be rewritten, flash memory cells having a stacked-gate structure are used to store the data. Flash memory cells are formed by using dedicated special processing different from standard CMOS processing. As such, in the case of disposing flash memory cells in a semiconductor integrated circuit such as a logic LSI circuit formed by using standard CMOS processing, the cost overhead due to dedicated special processing need to be restrained by, for example, making the memory capacity to be of a mass-storage type.

In practice, however, in semiconductors integrated circuits such as system LSI circuits in which a plurality of functions are integrated, almost no necessities arise for non-volatilely storing large-size data. As such, it is sufficient for such a semiconductor integrated circuit to have memory elements each with a small capacity for non-volatilely storing a small-size of data, such as circuit-operation related trimming data, chip ID data, security code data, and redundancy data of a DRAM or SRAM, for example.

Such small-size data should be sufficient if it can be rewritten one time or several times at most, so that no needs arise for guaranteeing, for example, 100,000 rewrites as in the case of a flash memory cell.

For these reasons, for semiconductor integrated circuits like system LSIs of the above described type, it is rather important that a small-size data as mentioned above is stored in non-volatile memory cells formable by using standard CMOS processing instead of dedicated special processing and that cost reduction is implemented thereby.

As non-volatile memory cells formable by using standard CMOS processing, fuse elements are disclosed in, for example, Patent References 1 and 2 listed hereunder:

Patent Reference 1: Jpn. Pat. Appln. KOKAI Publication No. 2002-76126; and

Patent Reference 2: Jpn. Pat. Appln. KOKAI Publication No. 2002-368096.

Conventionally, well-known fuse elements include laser pre-arced type fuse elements formed such that a metal wire or polysilicon wire is cut by using a laser. In recent years, however, in response to demands for enabling programming even after packaging, using electrically programmable fuses (like electrical fuses and anti-fuses) is going to be a mainstream in lieu of using laser pre-arced type fuse elements of the type described above.

Electrically programmable fuse elements include those of a type in which programming is implemented by cutting a wire with overcurrent and a type in which programming is implemented through insulator breakdown caused by voltage stress. In the fuse element of the former type, the state is switched from the conductive state to the nonconductive state through pre-arcing of the wire. In the fuse element of the latter type, the state is switched from the nonconductive state to the conductive state through a insulator breakdown.

Fuse elements intermediate with respect to the former and latter types described above include those of the type that uses a wire formed of a salicide layer and a polysilicon layer to form fuse elements. In the fuse elements of this type, programming is executed through insulator breakdown of the salicide layer by overcurrent application (increase in the resistance value), and data is read out by using a ratio of resistances before and after breakdown of the salicide layer.

FIG. 1 depicts an example of a prior-art fuse circuit (portion corresponding to one fuse set).

The fuse circuit is configured to include a fuse set FS, a program data latch circuit PDL, and a read data (fuse data) latch circuit RDL. The fuse set FS is configured of one enable-bit fuse element and m data fuse elements. The program data latch circuit PDL latches data En, Din1, Din2, ..., Dinm that are to be programmed into the m+1 fuse elements. The read data latch circuit RDL latches data En, Dout1, Dout2, ... Doutm that are to be read out from the m+1 fuse elements.

The enable-bit data En and the program data Din1, Din2, ..., Dinm may either be generated in a chip in which the fuse circuit is formed or be supplied from the outside of the chip. Upon power ON, the enable-bit data En and the fuse data Dout1, Dout2, ..., Doutm are latched by the read data latch circuit RDL and are then supplied into the circuits in the chip.

The enable-bit data En is used to determine validity/invalidity of data stored in the m electrically-fuse elements. For example, when the enable-bit data En is in a programmed state where, the for example, the data is "1" (="H"), the data stored in the m electrically-fuse elements become valid. On the other hand, however, when the enable-bit data En is in an unprogrammed state where, for example, the data is "0" (="L"), the data stored in the m electrically-fuse elements become invalid.

FIG. 2 is a detailed view of a portion of the example fuse circuit shown in FIG. 1.

For each fuse element FUSE, the illustrated example uses anti-fuse elements that execute programming through insulator breakdown.

Before programming, all the fuse elements FUSE in the fuse set FS are each maintained in the nonconductive state (initial state). The fuse elements FUSE are programmed corresponding to values of the program data Din1, Din2, ..., Dinm.

In programming, the enable-bit data En in the to-be-programmed fuse set becomes "1" and is latched into a program data latch circuit PDL (En). At this event, an output of the program data latch circuit PDL (En) becomes "L," which corresponds to the ground potential, for example. When a selection signal SEL becomes "H," a transistor N2 turns ON, whereby a high voltage VPP is applied to both ends of the fuse element FUSE in a fuse set FS(En).

Consequently, data "1" is programmed into the fuse element FUSE. Specifically, the insulator forming the fuse element FUSE is broken, whereby the fuse element FUSE changes from the nonconductive state to the conductive state.

In programming, the program data Din1, Din2, . . . , Dinm each become "1" or "0." For example, when the program data Din1 is "1," the data "1" is programmed similarly to the case of the enable-bit data En. When the program data Din1 is "0," the high voltage VPP is not applied to both ends of a fuse set FS(Din1). Accordingly, the insulator forming the fuse element FUSE is not broken, and "0" is programmed into the fuse element FUSE.

In a practical application, analog data stored in the fuse element FUSE needs to be converted into digital data to use the fuse data. As such, upon power ON, the fuse data are read out and latched into the read data (fuse data) latch circuits RDL.

In more specific, upon power ON, the reset signal RST is temporarily set to "H," and the state of the latch circuit is reset; that is, the data En, Dout1, Dout2, . . . , Doutm are all set to "L." Thereafter, the data in the fuse element FUSE is transferred to the read data latch circuit RDL.

For example, when the fuse element FUSE in the fuse set FS(En) is in a broken state (fuse data="1"), "1" is latched into the read data latch circuit RDL, and the output data En thereof becomes "H." When the fuse element FUSE in the fuse set FS(En) is in an unbroken state (fuse data="0"), "0" is latched into the read data latch circuit RDL, and the output data En thereof becomes "L."

During the power-on state, the read data latch circuit RDL keeps latching fuse data. The latched fuse data are output to, for example, to an internal circuit or the outside of the chip as output data Dout1, Dout2, . . . , Doutm via a data bus.

Thus, the electrically programmable fuse element exhibits an advantage in that fuse-programming can be implemented even after packaging. On the other hand, however, programming itself is performed according to physical variations of the material, in which once programming is performed, the state cannot be restored to the original pre-programming state.

Thus, in the prior-art fuse circuit, programming can be performed only once in unit of one fuse set; that is, fuse data cannot be rewritten into the same fuse set.

However, recent semiconductor integrated circuits have the demand for advanced features that allow rewrites of fuse data although the number of possible rewrites may be limited to be small.

One scheme contemplated to satisfy the demand is to mount flash memory cells on the circuit. However, this scheme cannot easily be employed as it offers the problem of requiring dedicated special processing, consequently leading to a cost increase. Another scheme contemplated is to provide the function of selecting a plurality of fuse sets by using external signals, thereby enabling fuse data to be rewritten. Nevertheless, however, the scheme causes an increase in the circuit size and complexity of the circuit configuration.

BRIEF SUMMARY OF THE INVENTION

A fuse circuit according to an aspect of the present invention, there is provided a fuse set constituted of a plurality of blocks, wherein each of the blocks comprises a sub-fuse set constituted of fuse elements electrically programmable, and a program control circuit which controls programming of the fuse elements, one of the fuse elements is an enable bit representing validity/invalidity of the sub-fuse set, and the program control circuit determines a block becoming an object of the programming among the blocks in accordance with a value of the enable bit.

BRIEF DESCRIPTION OF THE SEVERAL VIEWS OF THE DRAWING

FIG. 9 shows a schematic of a fuse circuit according to a second embodiment of the present invention;

FIG. 12 is a circuit diagram of the fuse circuit according to the second embodiment;

DETAIL DESCRIPTION OF THE INVENTION

A fuse circuit of an aspect of the present invention will be described below in detail with reference to the accompanying drawings.

1. Overview

When a small memory for storing data in a small size is formed by using standard CMOS processing to have a nonvolatile function, the memory is formed as a fuse element (such as an anti-fuse element using a gate structure of a MOS transistor). Data programming of the fuse element is physically carried out through pre-arcing and breakdown of the material, the fuse element itself cannot be restored to an original state.

In view of the above, in an embodiment of the invention, one fuse set is configured of a plurality of fuse blocks to rewrite fuse data. Sub-fuse sets formed of a plurality of fuse elements are arrayed in each of the fuse blocks, and fuse data is programmed into the sub-fuse set. According to a fuse circuit of the invention, a maximum value of the number of data rewrites to one fuse set is the same as the number of fuse blocks in the one fuse set.

At the time of programming of fuse data, a program control circuit selects one fuse block from the plurality of fuse blocks. The fuse block is selected in accordance with a value of enable-bit data in the each fuse block. The enable-bit data is programmed synchronously when the fuse data is programmed. As such, with the plurality of fuse blocks being-series connected, a to-be-programmed fuse block can be selected automatically in association with a data rewrite.

In a read of fuse data, the fuse data needs to be read from a fuse block into which latest fuse data is programmed, and the data need to be latched into a latch circuit. More specifically, when data has been rewritten, old fuse data needs to be invalid to prevent the old fuse data from being read. For this purpose, a read control circuit reads selects one fuse block into which latest fuse data is programmed from the plurality of fuse blocks. The latest fuse data is selected in accordance with the value of enable-bit data in the each fuse block.

As described above, in the fuse circuit according to the embodiment of the invention, one fuse set is configured of the plurality of fuse blocks (plurality of sub-fuse sets). Even in this case, since data in small size and rewritable in a few number of times is handled as object program data, the areal penalty is not significantly increased. Contrarily, with the configuration being employed, a semiconductor integrated circuit can be formed only using standard CMOS processing and without using dedicated special processing. Consequently, the fuse circuit usable in a wide application field can be provided at a low cost.

In addition, fuse-data programming/read is automatically executed for a specific fuse block by using the programming/read control circuit. For this reason, as viewed from the outside of the chip, the fuse circuit according to the embodiment of the invention is not different from a conventional unrewritable fuse circuit.

2. Fuse Circuit

Figure 3:
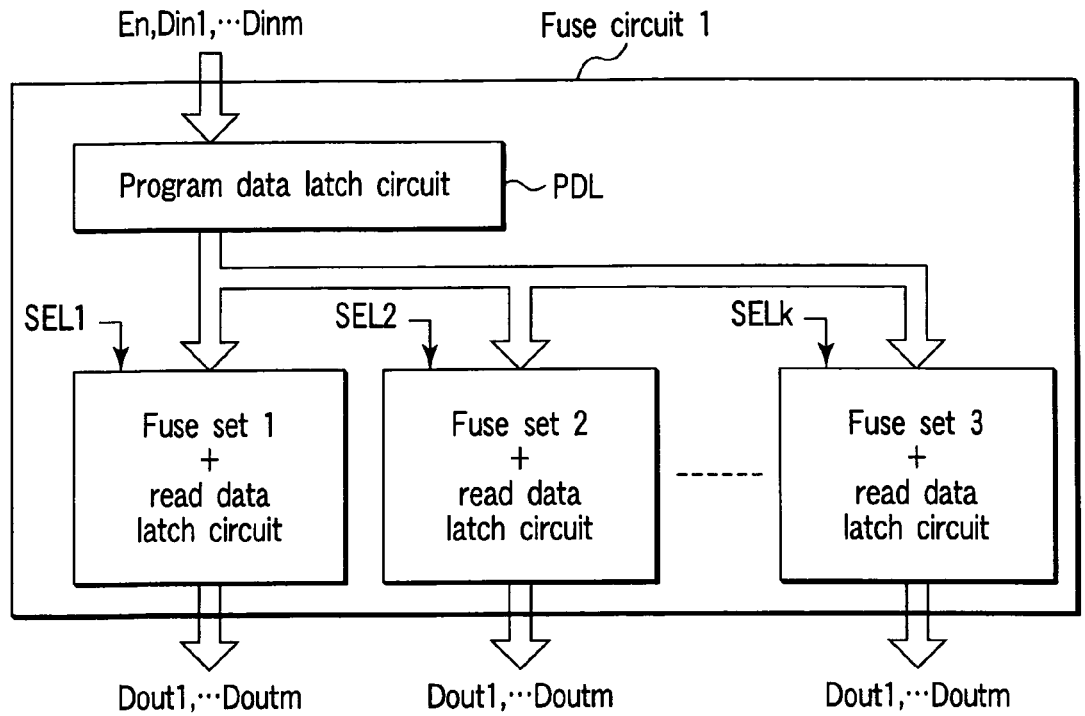
FIG. 3 is a view showing an example of the fuse circuit.

FIG. 3 shows a schematic of a fuse circuit.

A fuse circuit 1 is disposed in an arbitrary region to store small-size data, such as trimming data regarding the operation of an internal circuit, in a nonvolatile state.

Enable-bit data En and program data Din1, Din2, . . . , Dinm (m=plural number) are supplied from an internal circuit or the outside of an LSI chip, and are temporarily latched into a program data latch circuit PDL. The number of program data latch circuits PDL to be provided is optional; that is, one unit or multiple units thereof may be provided for fuse sets. In the present embodiment, one program data latch circuit PDL is provided for k fuse sets (k=plural number).

As described above, the k fuse sets are arrayed in the fuse circuit 1. In the present embodiment, each of the k fuse sets is associated in a pair with the one read data latch circuit, in which the each fuse set outputs fuse data Dout1, Dout2, . . . , Doutm.

For data programming, selection signals SEL1, SEL2, . . . , SELk select one of the fuse sets, and the data programming is executed for the selected fuse set.

In the prior-art fuse circuit, after data is once programmed into one fuse set, the data cannot be rewritten any more. In comparison, however, in the fuse circuit according to the embodiment of the invention, a predetermined number of data rewrites can be performed for the each fuse set.

The data rewrites are implemented by the plurality of sub-fuse sets arrayed in the each fuse set, as described below. In more specific, in each data rewrite, program data is programmed into one of the plurality of sub-fuse sets, so that latest program data is always read out from the sub-fuse set into-which latest program data is programmed.

The upper limit of the number of data rewrites is the same as the number of sub-fuse sets arrayed in the each fuse set.

Specific examples (embodiments) of fuse circuits of the rewritable type will be described hereinbelow.

3. First Embodiment (1) Fuse Sets

Figure 4:
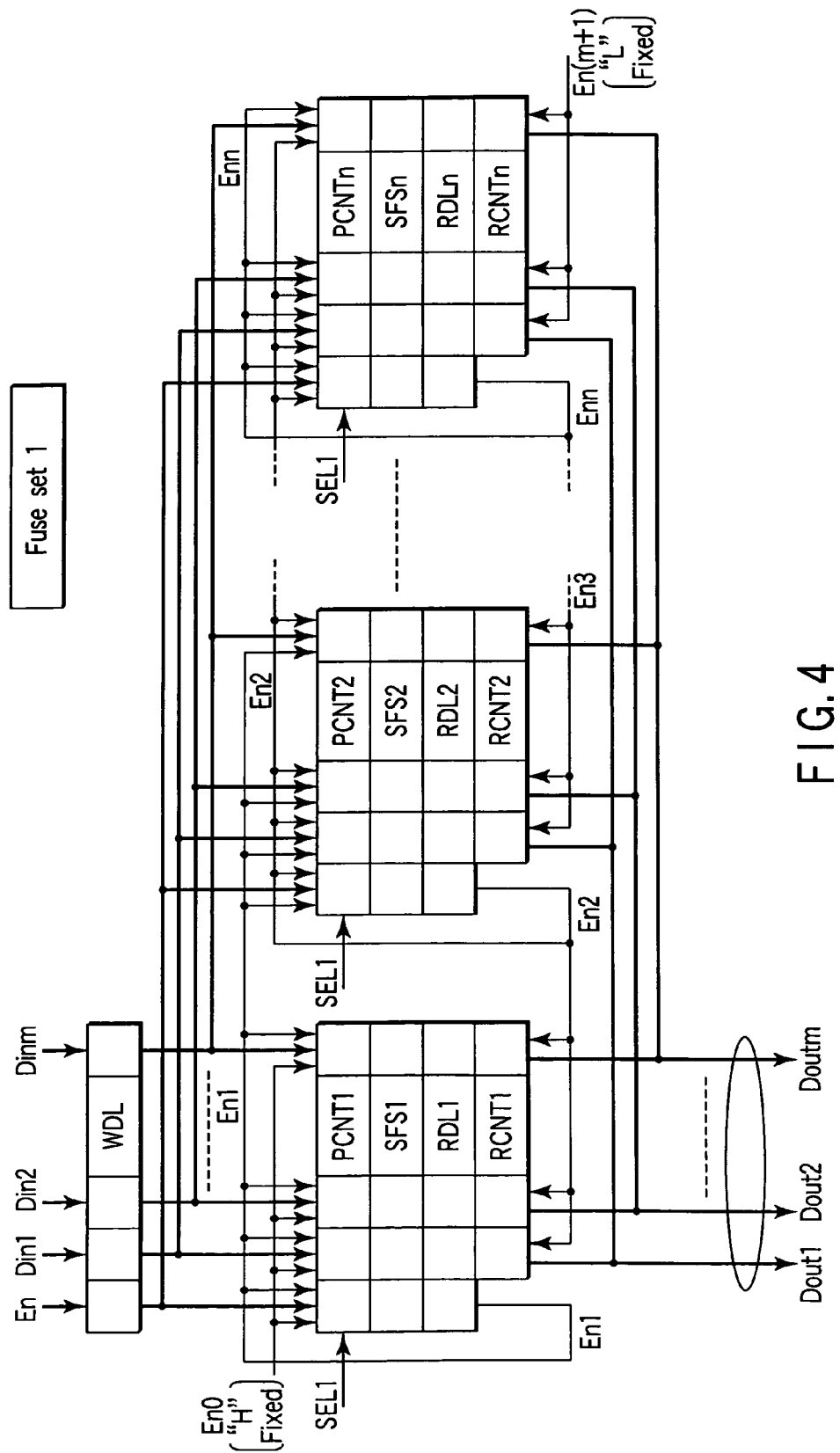
FIG. 4 shows a schematic of a fuse circuit according to a first embodiment of the present invention.

FIG. 4 shows major potions of a fuse circuit according to a first embodiment of the present invention.

The configuration shown in the drawing corresponds to one of the fuse sets shown in FIG. 3. The one fuse set has n fuse blocks BLK1, BLK2, . . . , BLKn (n=plural number). The each fuse block BLKi (i=1, 2, . . . , n) has sub-fuse sets SFSi configured of m+1 fuse elements (m=plural number); and m+1 program control circuits PCNTi and m+1 read data latch circuits RDLi that are provided corresponding to the sub-fuse sets SFSi.

The fuse blocks BLKi each have a read control circuit RCNTi. In addition, m fuse blocks BLKi are provided corresponding to the m read data latch circuits RDLi that latch m bits of fuse data excluding the enable-bit data.

One set of program data latch circuits PDL is commonly provided for n fuse blocks BLK1, BLK2, . . . , BLKn, for example. The program data latch circuit PDL temporarily latches the enable-bit data En and the program data Din1, Din2, . . . , Dinm. The input data, that is, the enable-bit data En and program data Din1, Din2, . . . , Dinm, are transferred to a selected one of the fuse blocks BLKi.

The n fuse blocks BLK1, BLK2, . . . , BLKn are series connected. In accordance with the enable-bit data, program control circuits PCNT1, PCNT2, . . . , PCNTn select one fuse block BLKj as a programming object from the n fuse blocks BLK1, BLK2, . . . , BLKn.

In more specific, in an i-th fuse block BLKi (i=1, 2, . . . , n), the program control circuit PCNTi determines selection/non-selection of the fuse block BLKi for data programming. The determination is conducted in accordance with a value of enable-bit data Eni in the fuse block BLKi and a value of enable-bit data En(i−1) in a previous (immediately-before) (i−1)th fuse block BLK(i−1).

However, no previous fuse block is present in the case of the first fuse block BLK1. The first fuse block BLK1 is the first programming object. As such, in the first fuse block BLK1, the program control circuit PCNT1 determines selection/non-selection of the fuse block BLK1 in accordance with a value of enable-bit data En1 in the fuse block BLK1 and a value (fixed to "H") of input data En0.

The enable-bit data Eni in the each fuse block BLKi is, for example, latched into the read data latch circuit RDLi immediately after power ON, and is fed back to the each fuse block BLK1.

In accordance with enable-bit data, read control circuits RCNT1, RCNT2, . . . , RCNTn select one data-read object block BLKj from the n fuse blocks BLK1, BLK2, . . . , BLKn.

In more specific, in the i-th the fuse blocks BLKi (i=1, 2, . . . , n), the read control circuit RCNTi determines selection/non-selection of the fuse block BLKi for data read. The determination is conducted in accordance with the value of enable-bit data Eni in the fuse block BLKi and a value of the next (immediately-after) (i+1)th in a fuse block BLK (i+1).

However, no next fuse block is present in the case of the last (n-th) fuse block BLKn. The last fuse block BLKn is the last programming object. As such, in the last fuse block BLK1, the read control circuit RCNTn determines selection/non-selection of the fuse block BLKn in accordance with a value of enable-bit data ENn in the fuse block BLKn and a value (fixed to "L") of input data En(n+1).

(2) Example Circuits

Figure 5:
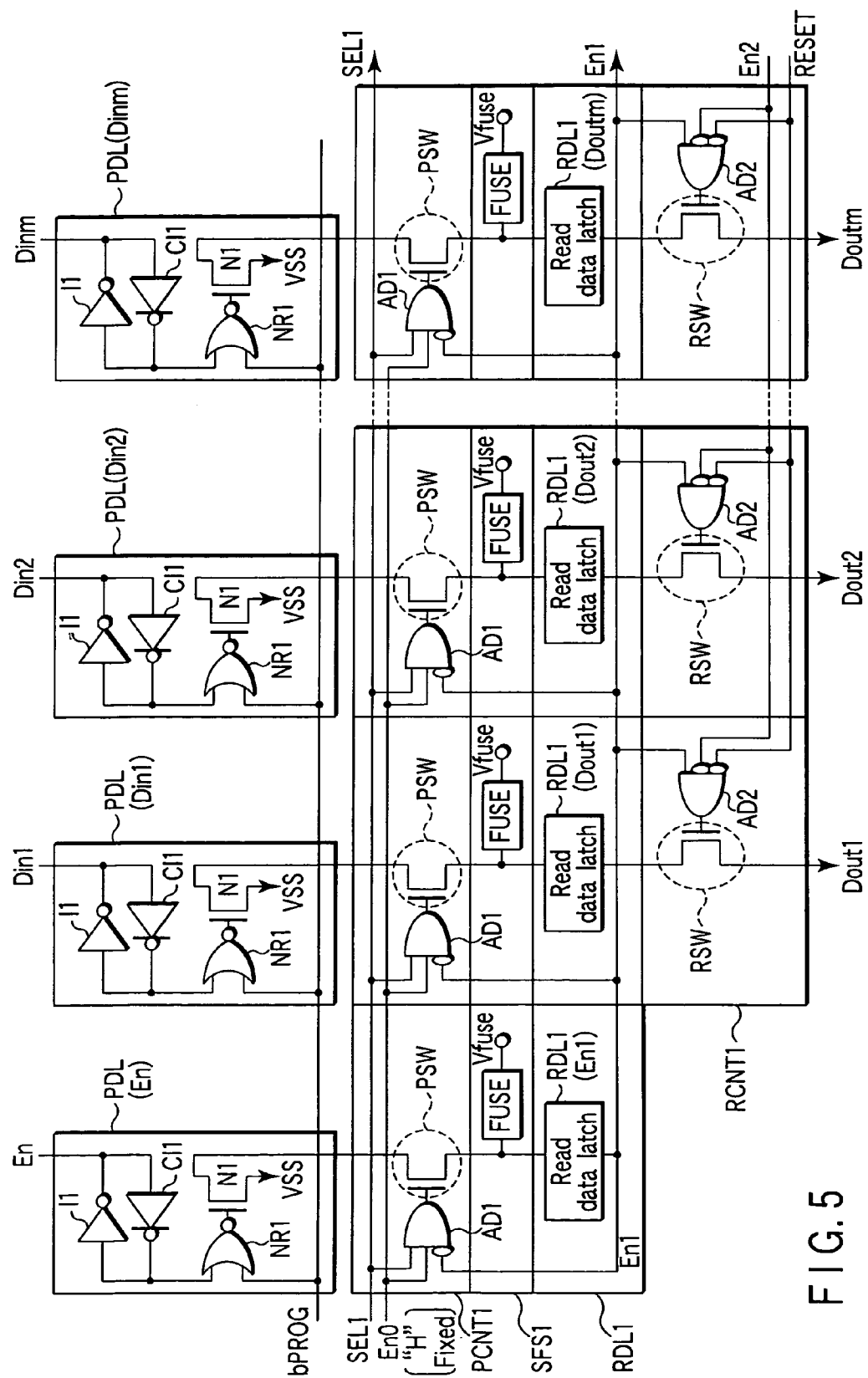
FIG. 5 is a circuit diagram of a fuse circuit according to the first embodiment.
Figure 6:
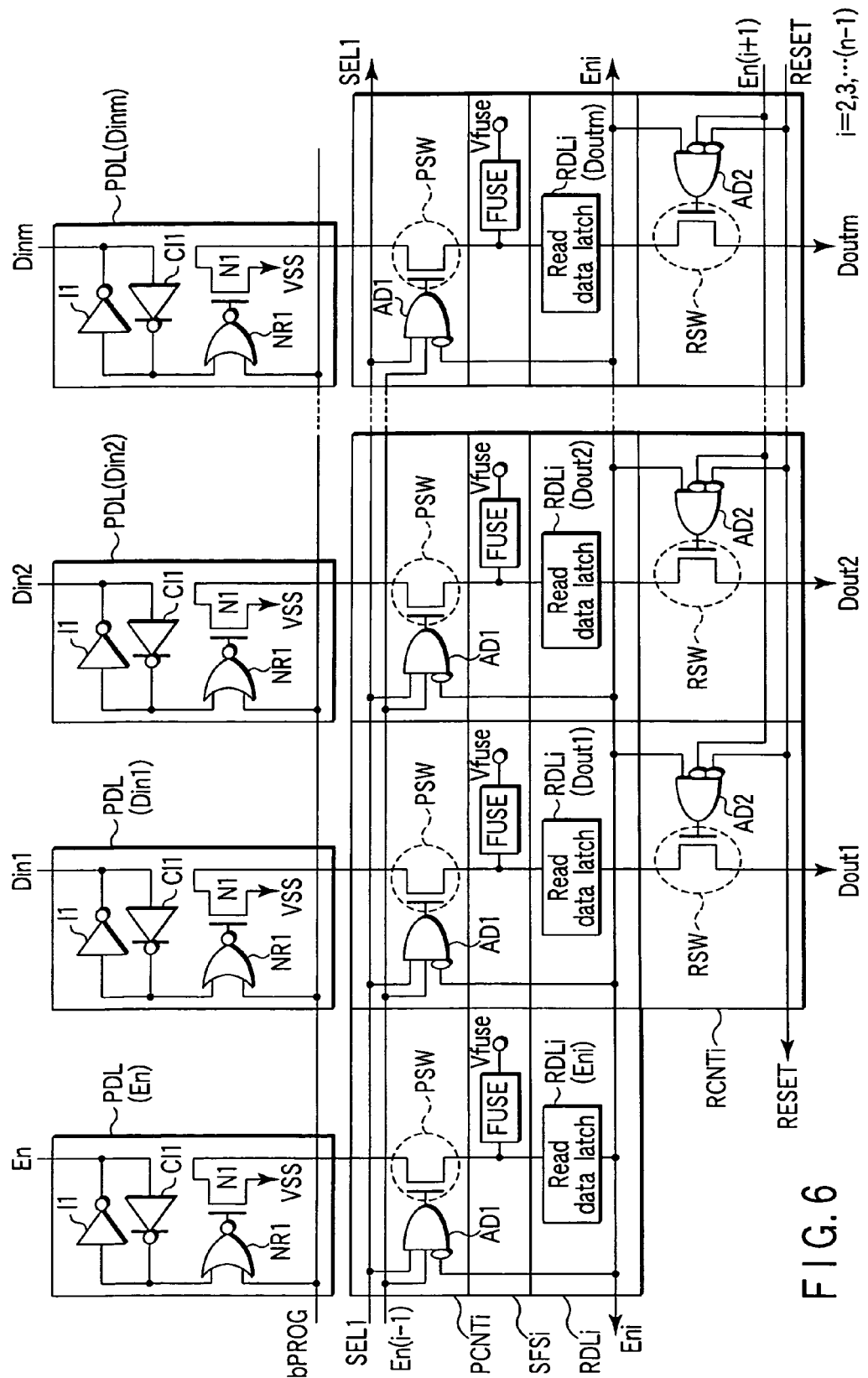
FIG. 6 is a circuit diagram of the fuse circuit according to the first embodiment.
Figure 7:
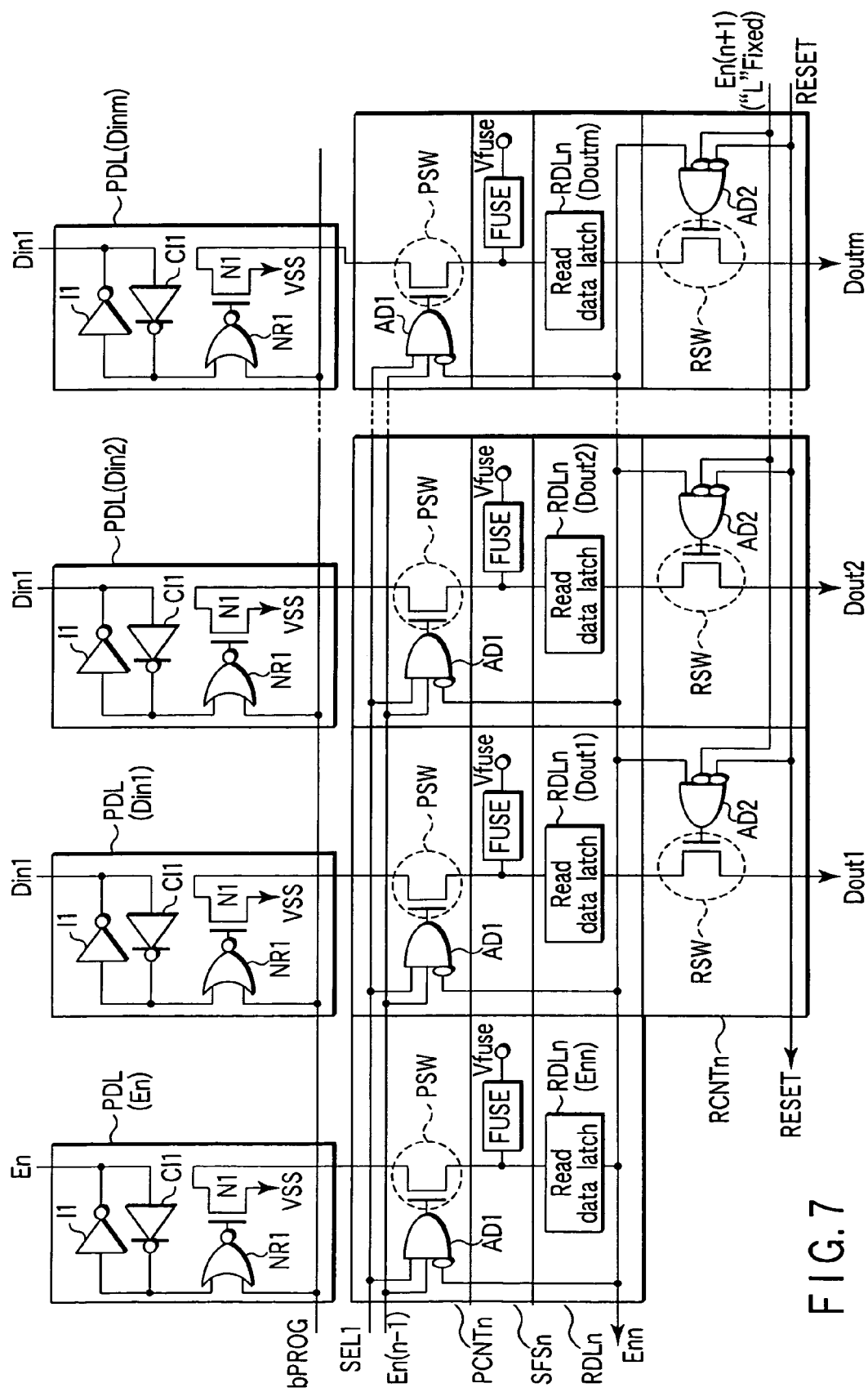
FIG. 7 is a circuit diagram of the fuse circuit according to the first embodiment.

FIGS. 5 to 7 each show an example of a circuit of the fuse block BLKi constituting the fuse set.

[1] Block BLK1

FIG. 5 shows an example of a circuit of the block BLK1.

1. Program Data Latch Circuits

A program data latch circuit PDL(En) latches enable-bit data En. In the configuration, m program data latch circuits PDL(Din1), . . . , PDL(Dinm) are provided corresponding to m bits of program data Din1, . . . , Dinm, and respectively latches the program data Dinm, . . . , Dinm.

All the program data latch circuits PDL(En), PDL(Din1), . . . , PDL(Dinm) have the same circuit configuration.

An inverter I1 and a clocked inverter CI1 together constitute a latch circuit. An output signal of the latch circuit is input to one input terminal of a NOR circuit NR1. An inverted signal bPROG of a program signal PROG is input to the input terminal of the NOR circuit NR1.

In programming, the program signal PROG becomes "H" and the inverted signal thereof becomes "L". As such, for programming, the NOR circuit NR1 outputs an output signal corresponding to the data latched into the latch circuit.

For example, when the data latched into the latch circuit is "1," that is, when the output signal of the clocked inverter CI1 is "L," the output signal of the NOR circuit NR1 becomes "H." This turns ON an n-channel MOS transistor N1. When the data latched into the latch circuit is "0," that is, when the output signal of the clocked inverter CI1 is "H," the output signal of the NOR circuit NR1 becomes "L." This turns OFF the n-channel MOS transistor N1.

2. Program Control Circuits

A program control circuit PCNT1 is configured of an AND circuit AD1 and a program switch PSW.

In the AND circuit AD1, a fuse-set selection signal SEL1, an input data En0 (fixed to "H"), and an inverted signal of an enable-bit data En1 are individually input. For example, as shown in FIGS. 3 and 4, the fuse-set selection signal SEL1 becomes "H" at the time of the programming of the fuse circuit 1. Before programming of a sub-fuse set SFS1, the enable-bit data En1 is "L." That is, an output signal of a read data latch circuit RDL1(En1) is "L" (insulator of the anti-fuse remains unbroken).

Accordingly, when the selection signal SEL1 becomes "H," the output signal of the AND circuit AD1 becomes "H." Since the program switch PSW is the n-channel MOS transistor, it turns ON when the AND circuit AD1 becomes "H." Specifically, one end of a fuse element FUSE constituting the sub-fuse set SFS1 is electrically coupled to the program data latch circuits PDL(En), PDL(Din1), . . . , PDL(Dinm).

In programming, when, for example, the program data is "1," since both the n-channel MOS transistors N1 and the PSW turn ON, a high voltage Vfuse is applied to both ends of the fuse element FUSE. Consequently, the insulator forming the fuse element (anti-fuse) FUSE is broken, and the data "1" is programmed.

In addition, for example, when the program data is "0," the n-channel MOS transistor PSW is ON, but the n-channel MOS transistor N1 turns OFF. For this reason, the high voltage Vfuse is not applied to both ends of the fuse element FUSE. Consequently, the insulator forming the fuse element (anti-fuse) FUSE is not broken, and the data "0" is programmed.

3. Read Data Latch Circuits

In the configuration, m+1 read data latch circuits RDL1 (En1), RDL1 (Dout1), . . . , RDL1 (Doutm) are provided corresponding to m+1 fuse elements FUSE. The configurations of the read data latch circuits RDL1 (En1), RDL1 (Dout1), . . . , RDL1 (Doutm) correspond to those shown in FIG. 2, for example.

Since the example circuits of the read data latch circuits RDL1 (En1), RDL1 (Dout1), . . . , RDL1 (Doutm) have already been described in detail with reference to FIG. 2, description thereof is omitted herefrom.

However, it is essential that, for example, upon power-on, the read data latch circuits RDL1 (En1), RDL1(Dout1), . . . , RDL1(Doutm) are each initialized to the "0" state. That is, it is essential that these read data latch circuits RDL1 (En1), RDL1 (Dout1), RDL1(Doutm) are each initialized as the output signal to the "L" output state, and the states thereof vary corresponding to the fuse data.

4. Read Control Circuits

A read control circuit RCNT1 is configured of an AND circuit AD2 and a read switch RSW. In the configuration, m read control circuits RCNT1 are provided corresponding to the m fuse elements FUSE into which the program data Din1, . . . , Dinm are individually programmed. Thus, the present embodiment does not have a read control circuit corresponding to the fuse element FUSE into which the enable-bit data En1 is programmed.

However, the configuration may be provided with a read control circuit corresponding to the fuse element FUSE into which the enable-bit data En1 is programmed.

In the AND circuit AD2, an inverted signal of a reset signal RST, an enable-bit data En1 and an inverted signal of an enable-bit data En2 are individually input. For example, the reset signal RST temporarily becomes "H" upon power ON, and it thereafter stays at "L."

The enable-bit data En1 is "L" before programming of a sub-fuse set SFS1, and is "H" after programming of the sub-fuse set SFS1. The enable-bit data En2 is "L" before programming of a sub-fuse set SFS2, and is "H" after programming of the sub-fuse set SFS2.

In more specific, when data is programmed into the sub-fuse set SFS1 and data is not programmed into the sub-fuse set SFS2, the data programmed into the sub-fuse set SFS1 is latest. In this event, the read switch RSW is turned ON at power ON, for example.

When data is not programmed into the sub-fuse set SFS1 or SFS2, the read switch RSW can never turn ON. When data is programmed into the both sub-fuse set SFS1 and SFS2, the data programmed into the both sub-fuse set SFS1 and SFS2 can never be latest, so that the read switch RSW can never turn ON.

[2] Blocks BLKi (i=2, 3, . . . , n−1)

FIG. 6 shows an example of a circuit of a fuse block BLKi.

1. Program Data Latch Circuits

Since the configurations of the program data latch circuits PDL1 (En), PDL1 (Din1), . . . , PDL1 (Dinm) have already been described in the section of the fuse block BLK1, description thereof is omitted herefrom.

2. Program Control Circuits

The program control circuit PCNT1 is configured of an AND circuit AD1 and a read switch PSW.

In the AND circuit AD1, a fuse-set selection signal SEL1, an enable-bit data En(i−1), and an inverted signal of an enable-bit data Eni are individually input. As already described, the fuse-set selection signal SEL1 becomes "H" at the time of the programming of the fuse circuit 1.

The enable-bit data En(i−1) is "L" before programming of a sub-fuse set SFS(i−1), and is "H" after programming of the sub-fuse set SFS(i−1). The enable-bit data Eni is "L" before programming of a sub-fuse set SFSi, and is "H" after programming of the sub-fuse set SFSi.

That is, an output signal of the AND circuit AD1 can become "H" after programming of the sub-fuse set SFS(i−1) and before programming of the sub-fuse set SFSi.

When the output signal of the AND circuit AD1 becomes "H," the output signal of the n-channel MOS transistor used as the program switch PSW turns ON. Specifically, one end of the fuse element FUSE constituting the sub-fuse set SFSi is electrically coupled to the program data latch circuits PDL(En), PDL(Din1), . . . , PDL(Dinm).

3. Read Data Latch Circuits

In the configuration, m+1 read data latch circuits RDLi (Eni), RDLi(Douti), . . . , RDLi(Doutm) are provided corresponding to m+1 fuse elements FUSE. The configurations corresponding to those of the read data latch circuits RDLi(Eni), RDLi(Dout1), . . . , RDLi(Doutm) have already been described, description thereof is omitted herefrom.

4. Read Control Circuits

A read control circuit RCNTi is configured of an AND circuit AD2 and a read switch RSW. In the configuration, m read control circuits RCNTi are provided corresponding to the m fuse elements FUSE into which the program data Din1, . . . , Dinm are individually programmed.

In the AND circuit AD2, an inverted signal of a reset signal RST, an enable-bit data Eni, and an inverted signal of an enable-bit data En(i+1) are individually input. For example, the reset signal RST temporarily becomes "H" upon power ON, and it thereafter stays at "L."

The enable-bit data Eni is "L" before programming of a sub-fuse set SFSi, and is "H" after programming of the sub-fuse set SFSi. The enable-bit data En(i+1) is "L" before programming of a sub-fuse set SFS(i+1), and is "H" after programming of the sub-fuse set SFS(i+1).

In more specific, when data is programmed into the sub-fuse set SFSi and data is not programmed into the sub-fuse set SFS(i+1), the data programmed into the sub-fuse set SFSi is latest. In this event, the read switch RSW is turned ON upon power ON, for example.

When data is not programmed into the sub-fuse set SFSi or SFS(i+1), the read switch RSW can never turn ON. When data is programmed into the both sub-fuse sets SFSi and SFS(i+1), the data programmed into the sub-fuse set SFS(i+1) is latest, so that the read switch RSW can never turn ON.

[3] Blocks BLKn

FIG. 7 shows an example of a circuit of a block BLKn.

1. Program Data Latch Circuits

The configurations of the program data latch circuits PDL(En), PDL(Din1), . . . , and PDL(Dinm) have already been described in the section of the fuse block BLK1, description thereof is omitted herefrom.

2. Program Control Circuits

The program control circuit PCNT1 is configured of an AND circuit AD1 and a read switch PSW.

In the AND circuit AD1, a fuse-set selection signal SEL1, an enable-bit data En(n−1), and an inverted signal of an enable-bit data Enn are individually input. As already described, the fuse-set selection signal SEL1 becomes "H" at the time of the programming of the fuse circuit 1.

The enable-bit data En(n−1) is "L" before programming of a sub-fuse set SFS(n−1), and is "H" after programming of the sub-fuse set SFS(n−1). The enable-bit data Enn is "L" before programming of a sub-fuse set SFSn, and is "H" after programming of the sub-fuse set SFSn.

That is, an output signal of the AND circuit AD1 can become "H" after programming of the sub-fuse set SFS(n−1) and before programming of the sub-fuse set SFSn.

When the output signal of the AND circuit AD1 becomes "H," the output signal of the n-channel MOS transistor used as the program switch PSW turns ON. Specifically, one end of the fuse element FUSE constituting the sub-fuse set SFSn is electrically coupled to the program data latch circuits PDL(En), PDL(Din1), . . . , PDL(Dinm).

3. Read Data Latch Circuits

In the configuration, m+1 read data latch circuits RDLn (Enn), RDLn(Douti), . . . , and RDLn(Doutm) are provided corresponding to m+1 fuse elements FUSE. The configurations corresponding to those of the read data latch circuits RDLn(Enn), RDLn(Dout1), . . . , and RDLn(Doutm) have already been described, description thereof is omitted herefrom.

4. Read Control Circuits

A read control circuit RCNTn is configured of an AND circuit AD2 and a read switch RSW. In the configuration, m read control circuits RCNTn are provided corresponding to the m fuse elements FUSE into which the program data Din1, . . . , and Dinm are individually programmed.

In the AND circuit AD2, an inverted signal of a reset signal RST, an enable-bit data Enn, and an inverted signal of an enable-bit data En(n+1) are individually input. For example, the reset signal RST temporarily becomes "H" at power-on, and it thereafter stays at "L".

The enable-bit data Enn is "L" before programming of a sub-fuse set SFSn, and is "H" after programming of the sub-fuse set SFSn. The enable-bit data En(n+1) is always fixed to "L".

In more specific, when data is programmed into the sub-fuse set SFSn, the data programmed into the sub-fuse set SFSn is latest. In this event, the read switch RSW is turned ON upon power ON, for example.

When data is not programmed into the sub-fuse set SFSn, the read switch RSW can never turn ON.

(3) Operations

Operation of the fuse circuit shown in FIGS. 3 to 7 will now be described hereinbelow.

First, general operation of the fuse circuit will be described.

Figure 8:
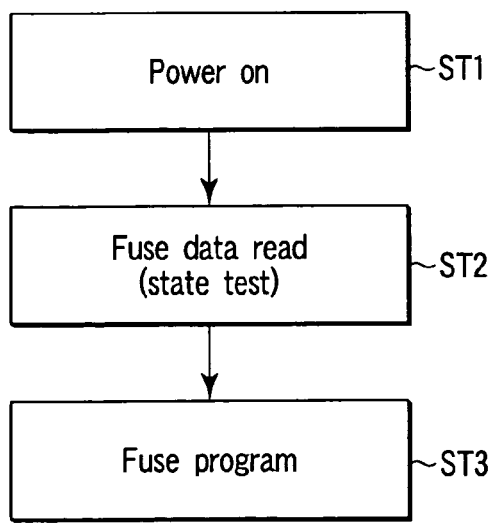
FIG. 8 is a view showing a chip operation in a power-on state.

FIG. 8 shows a schematic of the operation of the fuse circuit.

Upon power ON, when, for example, power is fed to an LSI chip, the state of a fuse set is tested. Specifically, a fuse-data read is executed to read out fuse data from the fuse set. At this event, the operation reads out also enable-bit data stored in a part of fuse elements in the fuse set (steps ST1 to ST2).

Thereafter, upon issuance of a command for a fuse program from, for example, a control circuit in the LSI chip or a CPU outside the LSI chip, the fuse program is executed (step ST3).

According to the prior art, fuse programming is allowed only one time, or a fuse set needs to be selected through dedicated special control to implement fuse programming.

However, the example of the invention enables fuse programming to be implemented such that fuse data can be automatically rewritten only with a command being issued for the fuse programming without performing dedicated special control for operations such as selection operations.

The operation of the fuse circuit according to the embodiment of the invention will be described hereinbelow in detail.

In the circuit configuration, as shown in FIGS. 3 to 7, one fuse set is configured to include n blocks (n=plural number), i.e., n sub-fuse sets. The each sub-fuse set is configured to include one fuse element that stores one bit of enable-bit data, and m fuse sets (m=plural number) that store m bits of fuse data.

According to the embodiment of the invention, control of the fuse-data read/programming and fuse-data rewrite is performed automatically in the fuse circuit in accordance with enable-bit data.

[Initial State]

Firstly, an initial state will be described hereinbelow.

TABLE 1

Initial state

|  |  | SFS1 | SFS2 | ... | SFSn |  |
|---|---|---|---|---|---|---|
| Enable bit data | En0 1 "H" fixed | En1 0 "L" | En2 0 "L" | ... | Enn 0 "L" | EN (n + 1) 0 "L" fixed |
| PSW |  | on | off | ... | off |  |
| RSW |  | off | off |  | off |  |

As shown in TABLE 1, in an initial state, specifically, in a state where even one program operation has not yet been executed for one fuse set, fuse elements (such as anti-fuse elements) in all sub-fuse sets SFS1, SFS2, . . . , SFSn are in unbroken states.

As such, for example, when power is fed to the LSI chip upon power ON, data "0s" ("L" levels) are read out as enable-bit data En1, En2, . . . , Enn from the respective sub-fuse sets SFS1, SFS2, . . . , SFSn, and the read data are then latched into read data latch circuits.

In the sub-fuse sets excluding the first sub-fuse set SFS1, that is, in the n−1 sub-fuse sets SFS2, SFSn, output signals of the AND circuits AD1 and AD2 shown in FIGS. 6 and 7 are all set to "L."

Accordingly, corresponding program switches PSW and read switches RSW are all set to OFF states, so that the sub-fuse sets SFS2, . . . , SFSn are not selected as either fuse programming or fuse-data read objects.

In the first sub-fuse set SFS1, since no sub-fuse set exists therebefore, an enable-bit signal En0 is input as an input signal to the AND circuit AD1 shown in FIG. 5. Since the enable-bit signal En0 is fixed to "H," the output signal of the AND circuit AD1 is "H" in the sub-fuse set SFS1. Accordingly, the program switch PSW is in the ON state, and the sub-fuse set SFS1 is electrically coupled to the program data latch circuits.

At this stage, since the output signal of the AND circuit AD2 shown in FIG. 5 is "L," the read switch RSW is in the OFF state.

Accordingly, after power ON, when, for example, a command for programming fuse data is fed to the LSI chip, and an enable-bit data En ("1") and program data ("0" or "1") are fed to the LSI chip, the data are latched into the program data latch circuits.

In accordance with values of the enable-bit data En and program data latched into the program data latch circuits, programming is executed for the fuse element FUSE in the sub-fuse set SFS1.

In more specific, since the enable-bit data En is "1" (="H"), a high voltage Vfuse is applied to both ends of the fuse element FUSE storing the enable-bit data En, and the fuse element FUSE is broken thereby. Concurrently, with regard to the program data, the value thereof is "0" or "1." As such, when the data is "0," the fuse element FUSE remains unbroken; and when the data is "1," the fuse element FUSE is broken.

Upon completion of the fuse programming for the sub-fuse set SFS1, the value of the enable-bit data En1 in the sub-fuse set SFS1 changes from "0" (="L") to "1" (="H").

Accordingly, in the sub-fuse set SFS1, the output signal of the AND circuit AD1 shown in FIG. 5 changes from "H" to "L," and the program switch PSW switches to the OFF state. Substantially at the same time, in the sub-fuse set SFS1, the output signal of the AND circuit AD2 shown in FIG. 5 changes from "L" to "H," and the read switch RSW switches to the ON state.

[Initial State after First Fuse Programming]

TABLE 2

Initial state after 1st fuse program

|  |  | SFS1 | SFS2 | ... | SFSn |  |
|---|---|---|---|---|---|---|
| Enable bit data | En0 1 "H" fixed | En1 1 "H" | En2 0 "L" | ... | Enn 0 "L" | EN (n + 1) 0 "L" fixed |
| PSW |  | off | on | ... | off |  |
| RSW |  | on | off |  | off |  |

As shown in TABLE 2, in an initial state after completion of the second fuse programming, the fuse element (enable-bit data) in the sub-fuse set SFS1 is in a broken state, and the fuse elements in the remaining sub-fuse sets SFS2, . . . , SFSn are in unbroken states.

As such, for example, power is fed to the LSI chip upon power ON, data "1" ("H" level) is read out as enable-bit data En1 from the sub-fuse set SFS1. Concurrently, data "0s" ("L" levels) are read out as enable-bit data En2, . . . , Enn from the respective sub-fuse sets SFS2, . . . , SFSn, and the read data are then latched into read data latch circuits.

In the first sub-fuse set SFS1, since the enable-bit signal En0 and En1 are "H," the output signals of the AND circuits AD1 shown in FIG. 5 are all set to "L." Accordingly, corresponding program switches PSW are set to the OFF states. Concurrently, since the enable-bit data En1 is "H" and the enable-bit data En2 is "L," the output signal of the AND circuit AD2 shown in FIG. 5 becomes "H," so that the read switches RSW are set to the ON states.

Accordingly, the sub-fuse set SFS1 having already been programmed is not selected as a fuse-programming object. However, since the sub-fuse set SFS1 contains latest fuse data, is selected as a fuse-data read object.

In the second sub-fuse set SFS2, since the enable-bit signal En1 is "H" and the enable-bit data En2 is "L," the output signals of the AND circuits ADD1 shown in FIG. 6 are all set to "H." Accordingly, corresponding program switches PSW are set to the ON states. Concurrently, since the enable-bit data En2 and En3 are "L," the output signals of the AND circuits AD2 shown in FIG. 6 become "L," so that the read switches RSW are set to the OFF states.

Accordingly, while the second sub-fuse set SFS2 is selected as a fuse-programming object (data rewrite object), it is not selected as a fuse-data read object.

In the third and subsequent sub-fuse sets SFS3, ..., SFSn, since enable-bit data En2, En3, ..., Enn are all "L," the output signals of the AND circuits AD1 and AD2 shown in FIGS. 6 and 7 are all set to "L." Accordingly, the program switches PSW and the read switches RSW are all in the OFF states, so that the sub-fuse sets SFS3, ..., SFSn are not selected as either fuse-programming or fuse-data read objects.

Accordingly, firstly after power ON, the fuse data in the sub-fuse set SFS1 are read out, and the state of the fuse set is verified. At this event, the enable-bit data En0 and En1 are verified as "H," the enable-bit data En2, ..., Enn are verified as "L," and the sub-fuse set SFS2 is electrically coupled to the program data latch circuits.

Thereafter, for example, when a command for programming fuse data is fed to the LSI chip, and an enable-bit data En ("1") and program data ("0" or "1") are fed to the LSI chip, the data are latched into the program data latch circuits.

In accordance with values of the enable-bit data En and program data latched into the program data latch circuits, programming is executed for the fuse element FUSE in the sub-fuse set SFS2.

In more specific, since the enable-bit data En is "1" (="H"), a high voltage Vfuse is applied to both ends of the fuse element FUSE storing the enable-bit data En, and the fuse element FUSE is broken thereby. Concurrently, with regard to the program data, the value thereof is "0" or "1." As such, when the data is "0," the fuse element FUSE remains unbroken; and when the data is "1," the fuse element FUSE is broken.

Upon completion of the fuse programming for the sub-fuse set SFS2, the value of the enable-bit data En1 in the sub-fuse set SFS2 changes from "0" (="L") to "1" (="H").

Accordingly, in the sub-fuse set SFS2, the output signal of the AND circuit AD1 shown in FIG. 5 changes from "H" to "L," and the program switch PSW switches to the OFF state. Substantially at the same time, in the sub-fuse set SFS2, the output signal of the AND circuits AD2 shown in FIG. 6 changes from "L" to "H," and the read switches RSW switch to the ON states.

[Initial State after Second Fuse Programming]

TABLE 3

| | Initial state after 2nd fuse program | | | | | |
|---|---|---|---|---|---|---|
| | SFS1 | SFS2 | SFS3 | ... | SFSn | |
| Enable bit data | En0 1 "H" fixed | En1 1 "H" | En2 1 "H" | En3 0 "L" | ... | Enn 0 "L" | EN (n + 1) 0 "L" fixed |
| PSW | off | off | on | | ... off | |
| RSW | off | on | off | | off | |

As shown in TABLE 3, in an initial state after completion of the second fuse programming, the fuse elements (enable-bit data) in the remaining sub-fuse sets SFS1 and SFS2 are in broken states, and the fuse elements (enable-bit data) in the remaining sub-fuse sets SFS3, ..., SFSn are in unbroken states.

As such, for example, when power is fed again to the LSI chip upon power ON, data "1s" ("H" levels) are read out as enable-bit data En1 and En2 from the respective sub-fuse sets SFS1 and SFS2. Concurrently, data "0s" ("L" levels) are read out as enable-bit data En3, ..., Enn from the respective sub-fuse sets SFS3, SFSn, and the read data are then latched into read data latch circuits.

Since operations in the present case is substantially the same as those described under the section "Initial State After Second Fuse Programming," detailed descriptions are omitted herefrom. In the present case, however, since latest program data is stored in the sub-fuse set SFS2, the read switch RSW in the sub-fuse set SFS2 is set to the ON state. In addition, when executing data rewrite to store new program data into a fuse element, the sub-fuse set SFS3 is selected as a programming object. Accordingly, the program switch PSW in the sub-fuse set SFS3 turns ON.

[Initial State after n-th Fuse Programming]

TABLE 4

| | Initial state after n-th fuse program | | | | | |
|---|---|---|---|---|---|---|
| | SFS1 | SFS2 | SFS3 | ... | SFSn | |
| Enable bit data | En0 1 "H" fixed | En1 1 "H" | En2 1 "H" | En3 1 "H" | ... | Enn 1 "H" | EN (n + 1) 0 "L" fixed |
| PSW | off | off | off | ... off | | |
| RSW | off | off | off | on | | |

As shown in TABLE 4, in an initial state after completion of the n-th fuse programming, the fuse elements (enable-bit data) in all the sub-fuse sets SFS1, SFS2, ..., SFSn are in unbroken states.

As such, for example, when power is fed to the LSI chip power ON, data "1s" ("H" levels) are read out as enable-bit data En1, En2, ..., Enn from the respective sub-fuse sets SFS1, SFS2, ..., SFSn, and the read data are then latched into read data latch circuits.

In the present embodiment of the invention, since no fuse set subsequent to the sub-fuse set SFSn is present, the maximum number of data rewrites is n in the fuse circuit of the invention. In addition, as shown in FIG. 7, since no sub-fuse set SFS subsequent to the sub-fuse set SFSn is present, an inverted signal of a signal at "L" (fixed), that is, a signal at "H," is fed as enable-bit data En(n+1) to the AND circuit AD2 in the sub-fuse set SFSn. Accordingly, the read switch RSW in the sub-fuse set SFSn is set to the ON state.

[4] Summary

As described above, in the fuse circuit according to the embodiment of the invention, one fuse set is configured of n sub-fuse sets (n=plural numbers), thereby enabling n data rewrites to be implemented.

Even in the configuration, the fuse-data read/programming or rewrite is performed only by inputting the fuse data into the fuse circuit without performing dedicated special control.

In specific, for programming, a data-write object sub-fuse set can be automatically determined in such a manner that a value of enable-bit data in the sub-fuse set is fed back in the fuse circuit. Also for read, a data-read object sub-fuse set can be automatically determined in such a manner that a value of enable-bit data in a sub-fuse set is fed back in the fuse circuit.

By way of a summary of the above detailed description, in the fuse circuit according to the embodiment of the invention, fuse-set programming can be implemented n times at maximum. In addition, every time a data rewrite is performed, the programming object changes one by one in the direction from the sub-fuse set SFS1 to the sub-fuse set SFSn.

The operation control as described above is performed only in the fuse circuit. As such, in view of the control circuit that feeds the program data to the fuse circuit, only the feeding of the program data is sufficient to implement the operation control. Accordingly, the control can be implemented substantially by using the prior-art programming scheme as it is, with which only one-time programming can be performed.

More specifically, in the fuse circuit according to the above-described embodiment of the invention, a data-read object and a programming object are automatically selected from the sub-fuse sets in the fuse circuit. Consequently, data-write dedicated special control need not be performed.

In the embodiment described above, the enable-bit signal En0 fixed to "H" is used in the first sub-fuse set SFS1, and the enable-bit signal En(n+1) fixed to "L" is used in the last sub-fuse set SFSn. These signals are used to provide uniform layouts of the all the sub-fuse sets SFS1, SFS2, . . . , SFSn.

However, in the first sub-fuse set SFS1, the enable-bit signal En0 may not be used, and two signals may be input to the AND circuit AND circuit AD1. Also, in the last sub-fuse set SFSn, the enable-bit data En(n+1) may not be used, and two signals may be input to the AND circuit AD2.

4. Second Embodiment

In comparison with the first embodiment described above, although a second embodiment is the same in the programming-related circuits, it has significant differences in the read-related circuits. The differences are attributed to the configuration different in that read data latch circuits for fuse data are shared by n sub-fuse sets (n=plural number).

The first embodiment has the configuration in which the read data latch circuit for fuse data is provided in each of the sub-fuse sets. In this configuration, as the number of the sub-fuse sets, that is, the maximum value of the number of data rewrites is increased, the number of read data latch circuits needs to be increased. This consequently leads to the problem of increasing the layout area of the fuse circuit.

To overcome the problem, that is, to restrain the increase in the layout area of the fuse circuit, the second embodiment has the configuration in which one set of read data latch circuits is commonly provided for the n sub-fuse sets. An object sub-fuse set of coupling to the read data latch circuit is determined (selected) by the read control circuit, as in the first embodiment.

Also for the second embodiment, what can be arranged to common are read data latch circuits for date that is used in the internal circuits. However, the read data latch circuit for the enable-bit data indicative of validity/invalidity of the sub-fuse set needs to discreetly be provided for the each sub-fuse set.

The reason for the above is that, the fuse circuits according to the embodiments of the invention control in accordance with the values of enable-bit data to select object sub-fuse set for the data-rewrite operation, that is, for the programming execution, and to select object fuse data for readout operation.

That is, in the fuse circuits according to the embodiments of the invention, values of enable-bit data of all the sub-fuse sets need to be immediately recognized upon power ON. For this reason, the read data latch circuit for the enable-bit data is discreetly provided for the each sub-fuse set.

At power ON, the first embodiment needs to perform only one readout operation to read out fuse data, that is, only one latch operation to latch the data into the read data latch circuits. However, at power ON, the second embodiment needs to perform two readout operation to read out fuse data, that is, two latch operations to latch the data into the read data latch circuits.

In more specific, the first embodiment enables the operation to be performed such that, upon power ON, fuse data of all the sub-fuse sets are latched (first readout operation) at one time, and fuse data is then output only from a sub-fuse set selected in accordance with the enable-bit data.

However, the second embodiment requires the operation to be performed such that, upon power ON, enable-bit data are first latched, and a sub-fuse set is then selected (first readout operation). Thereafter, a further operation needs to be performed to latch fuse data in a selected sub-fuse set and to output the fuse data (second readout operation).

The fuse circuit according to the second embodiment will be described in detail hereunder.

(1) Fuse Sets

FIG. 9 shows major potions of the fuse circuit according to a second embodiment of the present invention.

The configuration shown in the drawing corresponds to one of the fuse sets shown in FIG. 3. The one fuse set has n fuse blocks BLK1, BLK2, . . . , BLKn (n=plural number). The each fuse block BLKi (i=1, 2, . . . , n) has sub-fuse sets SFSI configured of m+1 fuse elements (m=plural number); m+1 program control circuits PCNTi provided corresponding to the sub-fuse sets SFSi; and one read data latch circuit RDL(Eni) for latching enable-bit data.

The fuse blocks BLKi each have a read control circuit RCNTi. In addition, m fuse blocks BLKi are provided corresponding to the m sub-fuse sets SFSi that store m bits of fuse data excluding the enable-bit data.

In the present embodiment, one fuse set further has read data latch circuits RDL provided to be shared by n fuse blocks BLK1, BLK2, . . . , BLKn. The read data latch circuits RDL latches m bits of fuse data excluding the enable-bit data for one fuse block BLKi selected by the read control circuit RCNTi.

The program data latch circuit PDL temporarily latches the enable-bit data En and the program data Din1, Din2, . . . , Dinm. The input data, that is, the enable-bit data En and program data Din1, Din2, . . . , Dinm, are transferred to a selected one of the fuse blocks BLKi.

The n fuse blocks BLK1, BLK2, . . . , BLKn are series connected. In accordance with the enable-bit data, program control circuits PCNT1, PCNT2, . . . , PCNTn select one fuse block BLKj as a programming object from the n fuse blocks BLK1, BLK2, . . . , BLKn.

In more specific, in an i-th one of the fuse blocks BLKi (i=1, 2, . . . , n), the program control circuit PCNTi determines selection/non-selection of the fuse block BLKi for data programming. The determination is conducted in accordance with a value of enable-bit data Eni in the fuse block BLKi and a value of enable-bit data En(i−1) in the previous (immediately-before) (i−1)th fuse block BLK(i−1).

However, no previous fuse block is present in the case of the first fuse block BLK1. The first fuse block BLK1 is the first programming object. As such, in the first fuse block BLK1, the program control circuit PCNT1 determines selection/non-selection of the fuse block BLK1 in accordance with a value of enable-bit data En1 in the fuse block BLK1 and a value (fixed to "H") of input data En0.

The enable-bit data Eni in the each fuse block BLKi is, for example, latched into the read data latch circuit RDLi immediately after power ON, and is fed back to the each fuse block BLKi.

In accordance with enable-bit data, read control circuits RCNT1, RCNT2, . . . , RCNTn select one data-read object block BLKj from the n fuse blocks BLK1, BLK2, . . . , BLKn.

In more specific, in the i-th fuse blocks BLKi (i=1, 2, . . . , n), the read control circuit RCNTi determines selection/non-selection of the fuse block BLKi for data read. The determination is conducted in accordance with the value of enable-bit data Eni in the fuse block BLKi and a value of the next (immediately-after) (i+1)th in a fuse block BLK (i+1).

However, no next fuse block is present in the case of the last (n-th) fuse block BLKn. The last fuse block BLKn is the last programming object. As such, in the last fuse block BLK1, the read control circuit RCNTn determines selection/non-selection of the fuse block BLKn in accordance with a value of enable-bit data Enn in the fuse block BLKn and a value (fixed to "L") of input data En(n+1).

Fuse data is output from the one selected fuse block BLKi. The output fuse data is transferred to and latched into the read data latch circuit RDL to be shared by all the BLK1, BLK2, . . . , BLKn.

(2) Example Circuits

FIGS. 10 to 13 each show an example of a circuit of the fuse block BLKi constituting the fuse set.

[1] Block BLK1

Figure 10:
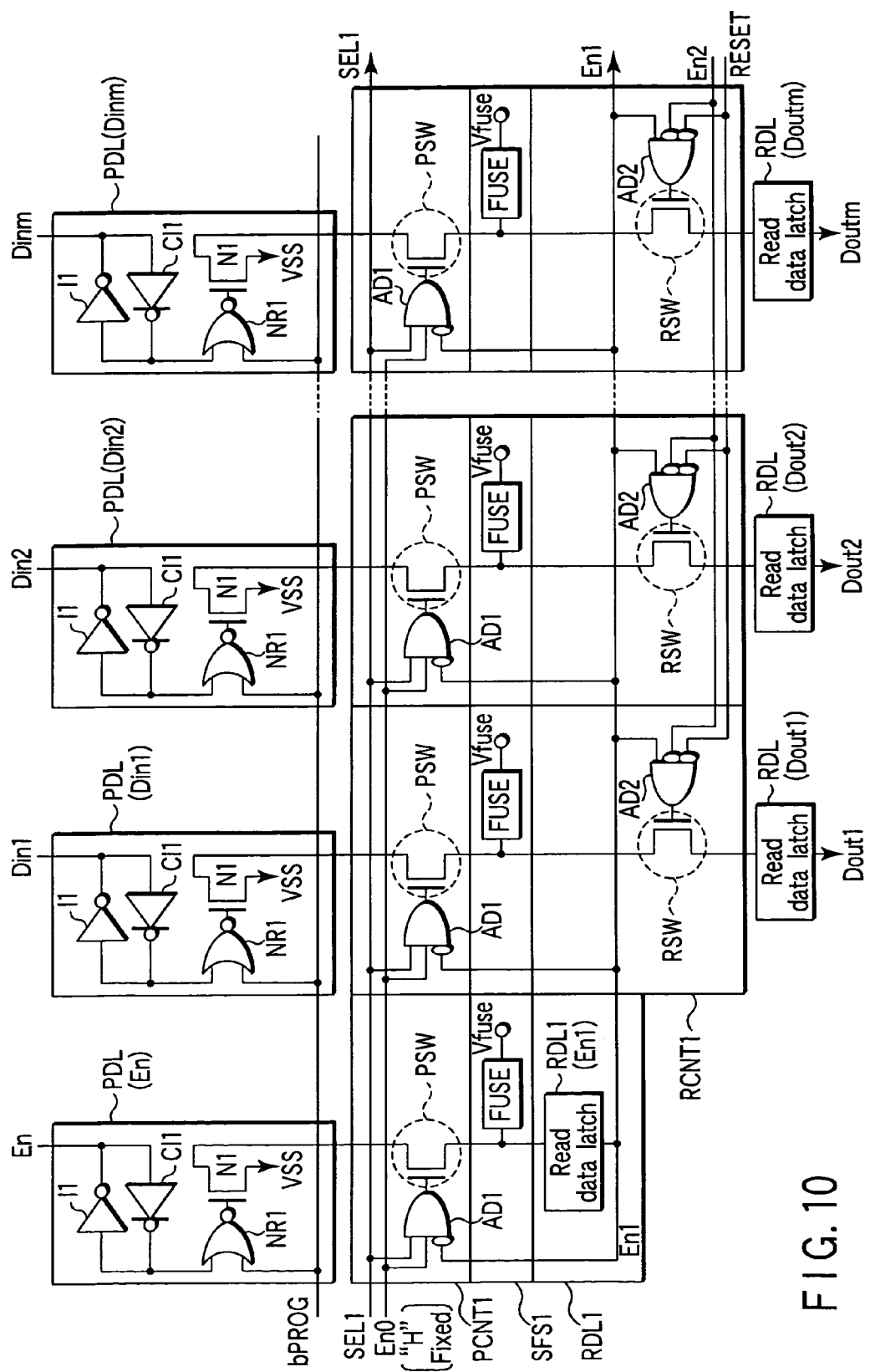
FIG. 10 is a circuit diagram of a fuse circuit according to the second embodiment.

FIG. 10 shows an example of a circuit of the block BLK1.

1. Program Data Latch Circuits

A program data latch circuit PDL(En) latches enable-bit data En. In the configuration, m program data latch circuits PDL(Din1), . . . , PDL(Dinm) are provided corresponding to m bits of program data Din1, . . . , Dinm, and respectively latches the program data Dinm, . . . , Dinm.

All the program data latch circuits PDL(En), PDL(Din1), . . . , PDL(Dinm) have the same circuit configuration.

An inverter I1 and a clocked inverter CI1 together constitute a latch circuit. An output signal of the latch circuit is input to one input terminal of a NOR circuit NR1. An inverted signal bPROG of a program signal PROG is input to the input terminal of the NOR circuit NR1.

In programming, the program signal PROG becomes "H" and the inverted signal thereof becomes "L". As such, for programming, the NOR circuit NR1 outputs an output signal corresponding to the data latched into the latch circuit.

For example, when the data latched into the latch circuit is "1," that is, when the output signal of the clocked inverter CI1 is "L," the output signal of the NOR circuit NR1 becomes "H." This turns ON an n-channel MOS transistor N1. When the data latched into the latch circuit is "0," that is, when the output signal of the clocked inverter CI1 is "H," the output signal of the NOR circuit NR1 becomes "L." This turns OFF the n-channel MOS transistor N1.

2. Program Control Circuits

A program control circuit PCNT1 is configured of an AND circuit AD1 and a program switch PSW.

In the AND circuit AD1, a fuse-set selection signal SEL1, an input data En0 (fixed to "H"), and an inverted signal of an enable-bit data En1 are individually input. For example, as shown in FIGS. 3 and 9, the fuse-set selection signal SEL1 becomes "H" in the execution of programming of the fuse circuit 1. Before programming of a sub-fuse set SFS1, the enable-bit data En1 is "L." That is, an output signal of a read data latch circuit RDL1 (En1) is "L" (insulator of the anti-fuse remains unbroken).

Accordingly, when the selection signal SEL1 becomes "H," the output signal of the AND circuit AD1 becomes "H." Since the program switch PSW is the n-channel MOS transistor, it turns ON when the AND circuit AD1 becomes "H." Specifically, one end of a fuse element FUSE constituting the sub-fuse set SFS1 is electrically coupled to the program data latch circuits PDL(En), PDL(Din1), . . . , PDL(Dinm).

At the time of programming, when, for example, the program data is "1," since both the n-channel MOS transistors N1 and the PSW turn ON, a high voltage Vfuse is applied to both ends of the fuse element FUSE. Consequently, the insulator forming the fuse element (anti-fuse) FUSE is broken, and the data "1" is programmed.

In addition, for example, when the program data is "0," the n-channel MOS transistor PSW is ON, but the n-channel MOS transistor N1 turns OFF. For this reason, the high voltage Vfuse is not applied to both ends of the fuse element FUSE. Consequently, the insulator forming the fuse element (anti-fuse) FUSE is not broken, and the data "0" is programmed.

3. Read Data Latch Circuits

Only one read data latch circuit RDL(En1) for latching the enable-bit data En1 is provided corresponding to the fuse element FUSE. In addition, m read data latch circuits RDL(Dout1), RDL(Dout2), . . . , RDL(Doutm) for latching m bits of fuse data excluding the enable-bit data En1 are provided corresponding to m fuse elements FUSE.

However, as described above, only one set of the read data latch circuits RDL(Dout1), RDL(Dout2), RDL(Doutm) is commonly provided for the plurality of blocks.

Figure 1:
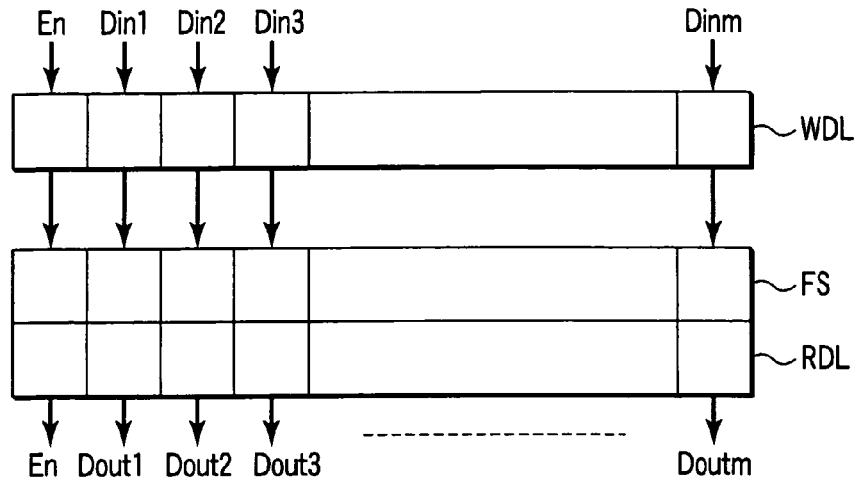
FIG. 1 is a schematic view of a prior-art fuse circuit.
Figure 2:
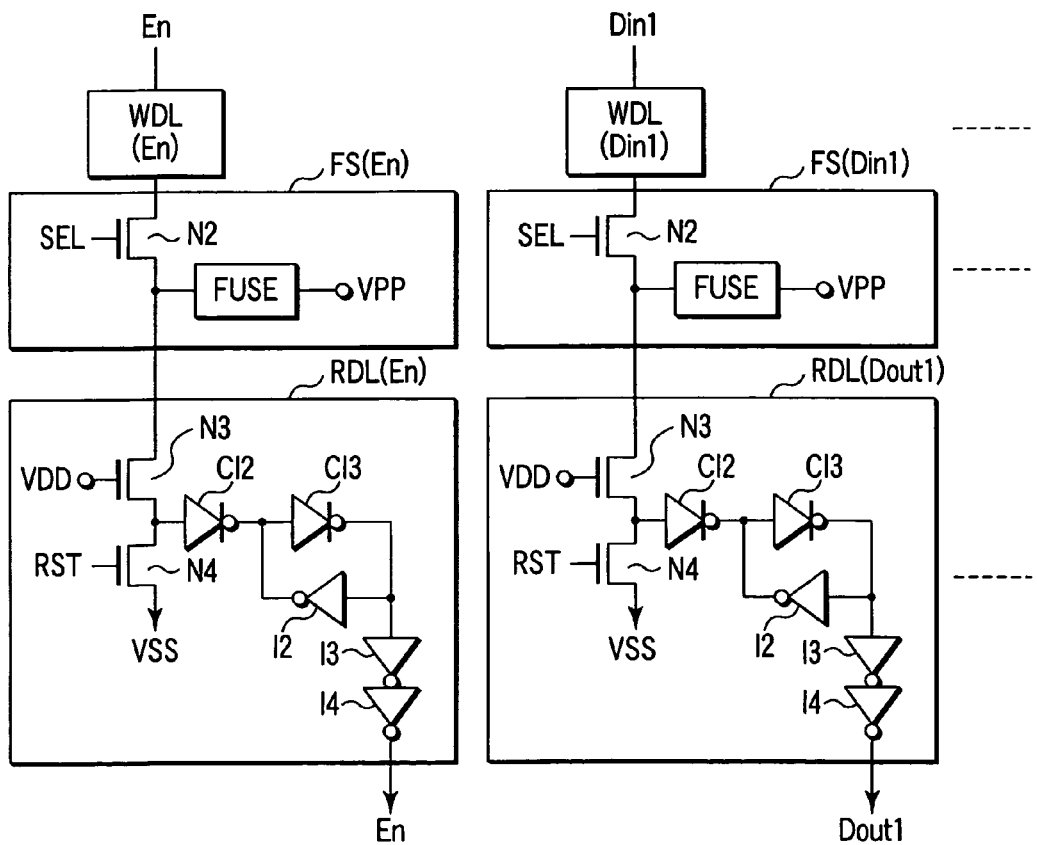
FIG. 2 is a circuit diagram showing the prior-art fuse circuit.

The configurations of the read data latch circuits RDL (En1), RDL(Dout1), . . . , RDL(Doutm) corresponding to those shown in FIG. 2, for example. The configurations have already been described with reference to FIG. 2, in detail with reference to FIG. 2, description thereof is omitted herefrom.

4. Read Control Circuits

A read control circuit RCNT1 is configured of an AND circuit AD2 and a read switch RSW. In the configuration, m read control circuits RCNT1 are provided corresponding to the m fuse elements FUSE into which the program data Din1, . . . , Dinm are individually programmed. Thus, the present example does not have a read control circuit corresponding to the fuse element FUSE into which the enable-bit data En1 is programmed.

However, the configuration may be provided with a read control circuit corresponding to the fuse element FUSE into which the enable-bit data En1 is programmed.

In the AND circuit AD2, an inverted signal of a reset signal RST, enable-bit data En1 and an inverted signal of enable-bit data En2 are individually input. For example, the reset signal RST becomes "H" upon power ON, and it thereafter stays at "L."

The enable-bit data En1 is "L" before programming of a sub-fuse set SFS1, and is "H" after programming of the sub-fuse set SFS1. The enable-bit data En2 is "L" before programming of a sub-fuse set SFS2, and is "H" after programming of the sub-fuse set SFS2.

In more specific, when data is programmed into the sub-fuse set SFS1 and data is not programmed into the sub-fuse set SFS2, the data programmed into the sub-fuse set SFS1 is latest. In this event, the read switch RSW is turned ON upon power ON, for example.

When data is not programmed into the sub-fuse set SFS1 or SFS2, the read switch RSW can never turn ON. When data is programmed into the both sub-fuse set SFS1 and SFS2, the data programmed into the both sub-fuse set SFS1 and SFS2 can never be latest, so that the read switch RSW can never turn ON.

[2] Blocks BLKi (i=2, 3, . . . , n−1)

Figure 11:
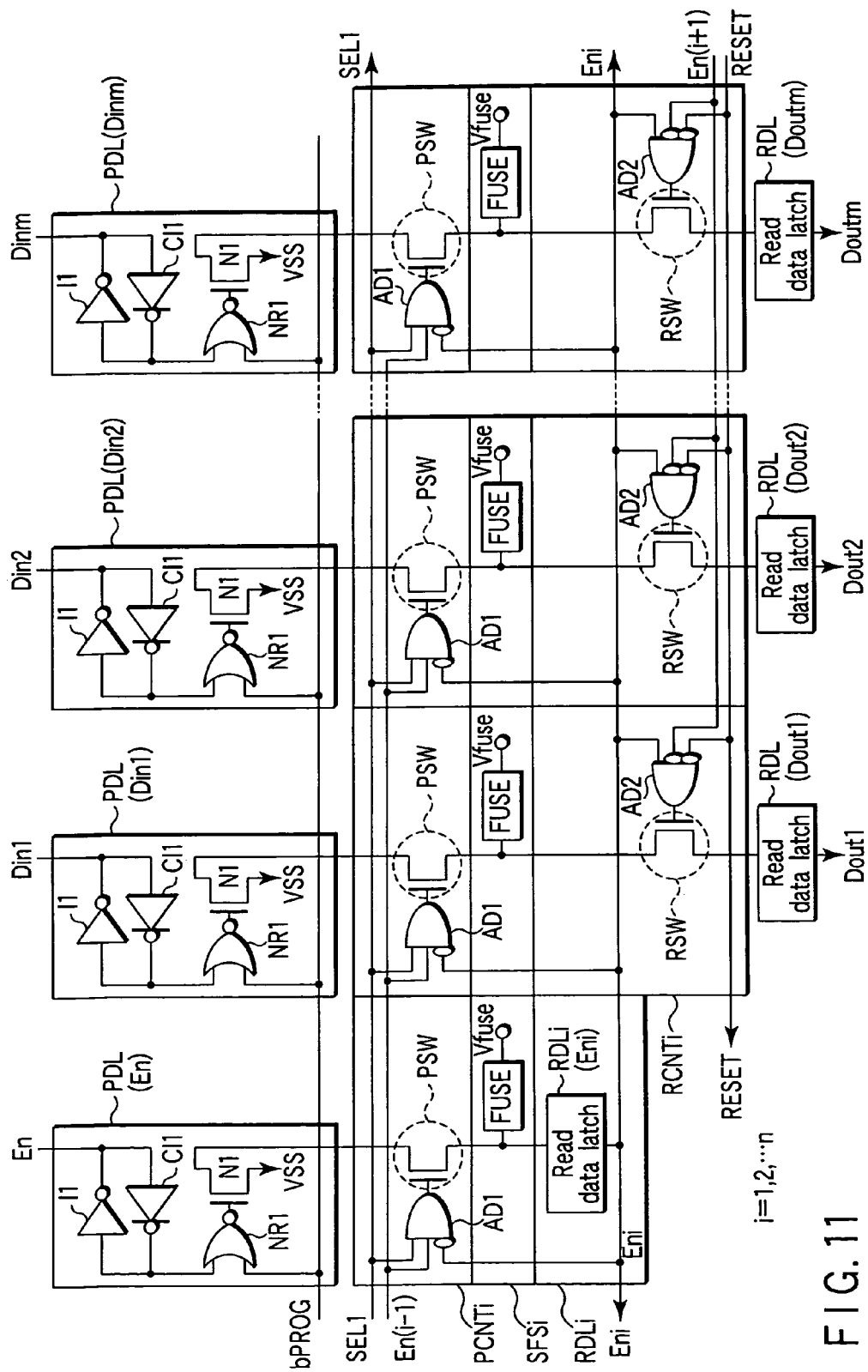
FIG. 11 is a circuit diagram of the fuse circuit according to the second embodiment.

FIG. 11 shows an example of a circuit of a fuse block BLKi.

1. Program Data Latch Circuits

Since the configurations corresponding to those of the program data latch circuits PDL(En), PDL1(Din), . . . , PDL(Dinm) have already been described in the section of the fuse block BLK1, description thereof is omitted herefrom.

2. Program Control Circuits

The program control circuit PCNT1 is configured of an AND circuit AD1 and a read switch PSW.

In the AND circuit AD1, a fuse-set selection signal SEL1, enable-bit data En(i−1), and an inverted signal of enable-bit data Eni are individually input. As already described, the fuse-set selection signal SEL1 becomes "H" at the time of the programming of the fuse circuit 1.

The enable-bit data En(i−1) is "L" before programming of a sub-fuse set SFS(i−1), and is "H" after programming of the sub-fuse set SFS(i−1). The enable-bit data Eni is "L" before programming of a sub-fuse set SFSi, and is "H" after programming of the sub-fuse set SFSi.

That is, an output signal of the AND circuit AD1 can become "H" after programming of the sub-fuse set SFS(i−1) and before programming of the sub-fuse set SFSi.

When the output signal of the AND circuit AD1 becomes "H," the output signal of the n-channel MOS transistor used as the program switch PSW turns ON. Specifically, one end of the fuse element FUSE constituting the sub-fuse set SFSi is electrically coupled to the program data latch circuit PDL(En), PDL(Din1), . . . , PDL(Dinm).

3. Read Data Latch Circuits

In the configuration, m+1 read data latch circuits RDL(Eni), RDL(Douti), . . . , RDL(Doutm) are provided corresponding to m+1 fuse elements FUSE. However, as described above, the m read data latch circuits RDL(Dout1), RDL(Dout2), . . . , RDL(Doutm) for latching m bits of fuse data excluding the enable-bit data Eni are shared by the plurality of blocks in one fuse set.

The circuit configurations of the read data latch circuits RDLi(Eni), RDLi(Dout1), . . . , RDLi(Doutm) have already been described, description thereof is omitted herefrom.

4. Read Control Circuits

A read control circuit RCNTi is configured of an AND circuit AD2 and a read switch RSW. In the configuration, m read control circuits RCNTi are provided corresponding to the m fuse elements FUSE into which the program data Din1, . . . , Dinm are individually programmed.

In the AND circuit AD2, an inverted signal of a reset signal RST, enable-bit data Eni, and an inverted signal of enable-bit data En(i+1) are individually input. For example, the reset signal RST temporarily becomes "H" upon power ON, and it thereafter stays at "L."

The enable-bit data Eni is "L" before programming of a sub-fuse set SFSi, and is "H" after programming of the sub-fuse set SFSi. The enable-bit data En(i+1) is "L" before programming of a sub-fuse set SFS(i+1), and is "H" after programming of the sub-fuse set SFS(i+1).

In more specific, when data is programmed into the sub-fuse set SFSi and data is not programmed into the sub-fuse set SFS(i+1), the data programmed into the sub-fuse set SFSi is latest. In this event, the read switch RSW is turned ON upon power ON, for example.

When data is not programmed into the sub-fuse set SFSi or SFS(i+1), the read switch RSW can never turn ON. When data is programmed into the both sub-fuse sets SFSi and SFS(i+1), the data programmed into the sub-fuse set SFS (i+1) is latest, so that the read switch RSW can never turn ON.

[3] Blocks BLKn

FIG. 12 shows an example of a circuit of a block BLKn.

1. Program Data Latch Circuits

Since the configurations of the program data latch circuits PDL(En), PDL(Din1), . . . , and PDL(Dinm) have already been described in the section of the fuse block BLK1, description thereof is omitted herefrom.

2. Program Control Circuits

The program control circuit PCNT1 is configured of an AND circuit AD1 and a read switch PSW.

In the AND circuit AD1, a fuse-set selection signal SEL1, enable-bit data En(n−1), and an inverted signal of enable-bit data Enn are individually input. As already described, the fuse-set selection signal SEL1 becomes "H" in at the time of the programming of the fuse circuit 1.

The enable-bit data En(n−1) is "L" before programming of a sub-fuse set SFS(n−1), and is "H" after programming of the sub-fuse set SFS(n−1). The enable-bit data Enn is "L" before programming of a sub-fuse set SFSn, and is "H" after programming of the sub-fuse set SFSn.

That is, an output signal of the AND circuit AD1 can become "H" after programming of the sub-fuse set SFS (n−1) and before programming of the sub-fuse set SFSn.

When the output signal of the AND circuit AD1 becomes "H," the output signal of the n-channel MOS transistor used as the program switch PSW turns ON. Specifically, one end of the fuse element FUSE constituting the sub-fuse set SFSn is electrically coupled to the program data latch circuit PDL(En), PDL(Din1), . . . , PDL(Dinm).

3. Read Data Latch Circuits

In the configuration, m+1 read data latch circuits RDL(Enn), RDL(Douti), . . . , and RDL(Doutm) are provided corresponding to m+1 fuse elements FUSE. However, as described above, the m read data latch circuits RDL(Dout1), RDL(Dout2), . . . , RDL(Doutm) for latching m bits of fuse data excluding the enable-bit data Eni are shared by the plurality of blocks in one fuse set.

The configurations corresponding to those of the read data latch circuits RDL(Eni), RDL(Dout1), . . . , and RDL (Doutm) have already been described, description thereof is omitted herefrom.

4. Read Control Circuits

A read control circuit RCNTn is configured of an AND circuit AD2 and a read switch RSW. In the configuration, m read control circuits RCNTn are provided corresponding to the m fuse elements FUSE into which the program data Din1, . . . , and Dinm are individually programmed.

In the AND circuit AD2, an inverted signal of a reset signal RST, enable-bit data Enn, and an inverted signal of enable-bit data En(n+1) are individually input. For example, the reset signal RST temporarily becomes "H" upon power ON, and it thereafter stays at "L."

The enable-bit data Enn is "L" before programming of a sub-fuse set SFSn, and is "H" after programming of the sub-fuse set SFSn. The enable-bit data En(n+1) is always fixed to "L.".

In more specific, when data is programmed into the sub-fuse set SFSn, the data programmed into the sub-fuse set SFSn is latest. In this event, the read switch RSW is turned ON upon power ON, for example.

When data is not programmed into the sub-fuse set SFSn, the read switch RSW can never turn ON.

(3) Operations

The operation of the fuse circuit shown in FIGS. 9 to 12 will now be described hereinbelow.

The overall operation of the fuse circuit according to the second embodiment is substantially the same as that according to the first embodiment. However, the circuit of the second embodiment is different in that two latch operations are performed to latch fuse data upon power ON.

Hereinbelow, the operation of the fuse circuit according to the second embodiment will be described.

In the configuration, as shown in FIGS. 9 to 12, one fuse set is configured to include n blocks (n=plural number), i.e., n sub-fuse sets. The each sub-fuse set is configured to include one fuse element that stores one bit of enable-bit data, and m fuse sets (m=plural number) that store m bits of fuse data.

[Initial State]

In an initial state, specifically, in a state where even one program operation has not yet been executed for one fuse set, fuse elements (such as anti-fuse elements) in all sub-fuse sets SFS1, SFS2, . . . , SFSn are in unbroken states.

As such, for example, when power is fed to the LSI chip upon power ON, data "0s" ("L" levels) are read out as enable-bit data En1, En2, . . . , Enn from the respective sub-fuse sets SFS1, SFS2, . . . , SFSn. The data having been read out are then latched into read data latch circuits RDL(En1), RDL(En2), . . . , RDL(Enn) (first latch operation).

In the sub-fuse sets excluding the first sub-fuse set SFS1, that is, in the n−1 sub-fuse sets SFS2, . . . , SFSn, output signals of the AND circuits AD1 and AD2 shown in FIGS. 11 and 12 are all set to "L." Accordingly, program switches PSW and read switches RSW are all set to the OFF states, so that the sub-fuse sets SFS2, . . . , SFSn are not selected as either fuse programming or fuse-data read objects.

In the first sub-fuse set SFS1, since no sub-fuse set exists therebefore, an enable-bit signal En0 is input as an input signal to the AND circuit AD1 shown in FIG. 10. Since the enable-bit signal En0 is fixed to "H," the output signal of the AND circuit AD1 is "H" in the sub-fuse set SFS1. Accordingly, the program switch PSW is in the ON state, and the sub-fuse set SFS1 is electrically coupled to the program data latch circuits.

At this stage, since the output signal of the AND circuit AD2 shown in FIG. 10 is "L," the read switch RSW is in the OFF state.

Upon latching of the enable-bit data En1, En2, . . . , Enn into the read data latch circuits RDL(En1), RDL(En2), . . . , RDL(Enn), read control circuits RCNT1, RCNT2, . . . , RCNTn individually determine ON/OFF of the read switches RSW in accordance with values of the data.

In the present case, since no fuse data is not written to any one of the sub-fuse sets SFS1, SFS2, . . . , SFSn in the blocks, the read switches RSW are in the OFF state in all the blocks. Hence, while a latch operation for fuse data (second latch operation) is to be performed, since latched data themselves are present, the read data latch circuits RDL (Dout1), RDL(Dout2), . . . , RDL(Doutm) are all set to "0s."

After power ON, when, for example, a command for programming fuse data is fed to the LSI chip, and an enable-bit data En ("1") and program data ("0" or "1") are fed to the LSI chip, the data are latched into the program data latch circuits.

In accordance with values of the enable-bit data En and program data latched into the program data latch circuits, programming is executed for the fuse element FUSE in the sub-fuse set SFS1.

In more specific, since the enable-bit data En is "1" (="H"), a high voltage Vfuse is applied to both ends of the fuse element FUSE storing the enable-bit data En, and the fuse element FUSE is broken thereby. Concurrently, with regard to the program data, the value thereof is "0" or "1." As such, when the data is "0," the fuse element FUSE remains unbroken; and when the data is "1," the fuse element FUSE is broken.

Upon completion of the fuse programming for the sub-fuse set SFS1, the value of the enable-bit data En1 in the sub-fuse set SFS1 changes from "0" (="L") to "1" (="H").

Accordingly, in the sub-fuse set SFS1, the output signal of the AND circuit AD1 shown in FIG. 10 changes from "H" to "L," and the program switch PSW switches to the OFF state. Substantially at the same time, in the sub-fuse set SFS1, the output signal of the AND circuit AD2 shown in FIG. 10 changes from "L" to "H," and the read switch RSW switches to the ON state.

[Initial State after First Fuse Programming]

In an initial state after completion of the second fuse programming, the fuse element in the sub-fuse set SFS1 is in a broken state, and the fuse elements (enable-bit data) in the remaining sub-fuse sets SFS2, . . . , SFSn are in unbroken states.

As such, for example, when power is fed to the LSI chip upon power ON, data "1" ("H" level) is read out as enable-bit data En1 from the sub-fuse set SFS1. Concurrently, data "0s" ("L" levels) are read out as enable-bit data En2, . . . , Enn from the respective sub-fuse sets SFS2, . . . , SFSn, and the data having been read out are then latched into the read data latch circuits RDL(En1), RDL(En2), . . . , RDL(Enn) (first latch operation).

In the first sub-fuse set SFS1, the enable-bit signal En0 and En1 are "H." Accordingly, the output signals of the AND circuits AD1 shown in FIG. 10 are all set to "L," so that corresponding program switches PSW are set to the OFF states. Concurrently, since the enable-bit data En1 is "H" and the enable-bit data En2 is "L," the output signals of the AND circuits AD2 shown in FIG. 10 become "H," so that the read switches RSW are set to the ON states.

Accordingly, the sub-fuse set SFS1 having already been programmed is not selected as a fuse-programming object. However, since the sub-fuse set SFS1 contains latest fuse data, is selected as a fuse-data read object.

In the second sub-fuse set SFS2, the enable-bit signal En1 is "H" and the enable-bit data En2 is "L." Accordingly, the output signals of the AND circuits ADD2 shown in FIG. 11 are all set to "H," so that corresponding program switches PSW are set to the ON states. In addition, since the enable-bit data En2 and En3 are "L," the output signals of the AND circuits AD2 shown in FIG. 11 become "L," so that the read switches RSW are set to the OFF states.

Accordingly, while the second sub-fuse set SFS2 is selected as a fuse-programming object (data rewrite object), it is not selected as a fuse-data read object.

In the third and subsequent sub-fuse sets SFS3, . . . , SFSn, enable-bit data En2, En3, . . . , Enn are all "L," so that the output signals of the AND circuits AD1 and AD2 shown in FIGS. 11 and 12 are all set to "L." Accordingly, the program switches PSW and the read switches RSW are all in the OFF states, so that the sub-fuse sets SFS3, . . . , SFSn are not selected as either fuse-programming or fuse-data read objects.

Thus, the enable-bit data En1, En2, . . . , Enn are latched into the respective read data latch circuits RDL(En1), RDL(En2), . . . , RDL(Enn), the respective read control circuits RCNT1, RCNT2. Then, the read control circuits RCNT1, RCNT2, . . . , RCNTn determine ON/OFF of the read switches RSW in accordance with values of the data.

In the present case, since fuse data are written into the sub-fuse set SFS1, the read switches RSW are in the ON states in the first block BLK1. Thereafter, a latch operation (second latch operation) is performed. Specifically, in the latch operation, the first block BLK1 is selected by the read control circuits RCNT1, RCNT2, . . . , RCNTn, the latched data stored in the sub-fuse set SFS1 are latched into read data latch circuits RDL(Dout1), RDL(Dout2), RDL(Doutm).

After power ON, since the enable-bit data En0 and En1 are "H" and the enable-bit data En2, . . . , Enn are "L," and the sub-fuse set SFS2 is electrically coupled to the program data latch circuits.

Accordingly, for example, when a command for programming fuse data is fed to the LSI chip, and an enable-bit data En ("1") and program data ("0" or "1") are fed to the LSI chip, the data are latched into the program data latch circuits.

In accordance with the values of the enable-bit data En and program data latched into the program data latch circuits, programming is executed for the fuse element FUSE in the sub-fuse set SFS2.

Upon completion of the fuse programming for the sub-fuse set SFS2, the value of the enable-bit data En1 in the sub-fuse set SFS2 changes from "0" (="L") to "1" (="H").

Accordingly, in the sub-fuse set SFS2, the output signal of the AND circuit AD1 shown in FIG. 11 changes from "H" to "L," and the program switch PSW switches to the OFF state. Substantially at the same time, in the sub-fuse set SFS2, the output signal of the AND circuits AD2 shown in FIG. 11 changes from "L" to "H," and the read switches RSW become the ON state.

[Initial State after n-th Fuse Programming]

In an initial state after completion of the n-th fuse programming, the fuse elements (enable-bit data) in all the sub-fuse sets SFS1, SFS2, . . . , SFSn are in unbroken states.

As such, for example, when power is fed to the LSI chip upon power ON, data "1s" ("H" levels) are read out as enable-bit data En1, En2, . . . , Enn from the respective sub-fuse sets SFS1, SFS2, . . . , SFSn, and the read data are then latched into read data latch circuits (first latch operation).

In the present case, since no fuse set subsequent to the sub-fuse set SFSn is present, the maximum number of data rewrites is n in the fuse circuit of the invention. In addition, as shown in FIG. 12, since no sub-fuse set SFS subsequent to the sub-fuse set SFSn is present, an inverted signal of a signal at "L" (fixed), that is, a signal at "H," is fed as enable-bit data En(n+1) to the AND circuit AD2 in the sub-fuse set SFSn. Accordingly, the read switch RSW in the sub-fuse set SFSn is set to the ON state.

In this case, since fuse data are written into all the sub-fuse sets SFS1, SFS2, . . . , SFSn, only the read switch RSW in the last block BLKn switches to the ON state.

As such, a fuse-data latch operation is subsequently performed (second latch operation). In the latch operation, the last fuse block BLKn is selected by the read control circuits RCNT1, RCNT2, . . . , RCNTn, and latched data stored in the sub-fuse set SFSn are latched into the read data latch circuits RDL(Dout1), RDL(Dout2), . . . , RDL(Doutm).

[4] Summary

As described above, also in the fuse circuit according to the second embodiment of the invention, one fuse set is configured of n sub-fuse sets (n=plural numbers), thereby enabling n data rewrites to be implemented.

Even in the configuration, the fuse-data read/programming or rewrite is performed only by inputting the fuse data into the fuse circuit without performing dedicated special control.

5. Application Examples

Described hereinbelow are application examples of an LSI chip including the fuse circuit according to the each embodiment of the invention and systems each using the LSI chip.

Figure 13:
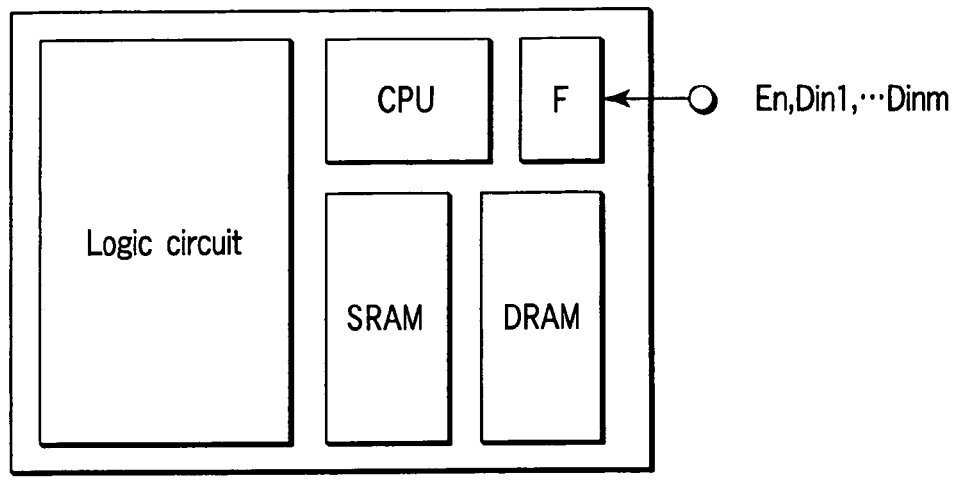
FIG. 13 is a view showing an example of a chip layout of a system LSI.

FIG. 13 depicts an example of a chip layout of a system LSI.

A CPU, a logic circuit, an SRAM, and a DRAM are formed on an LSI chip. The fuse circuit according to the each embodiment of the invention is disposed in an arbitrary position of the LSI chip. As viewed from the outside of the chip, there exist no differences between the prior-art example and the each embodiment of the invention with respect to signals to be fed to the chip and the control method. This is because, according to the each embodiment of the invention, the data rewrite to the fuse set is implemented without performing dedicated complex control.

For the LSI chip, functions (blocks) built into the chip are not limited to those of the present application example. Addition, reduction, and/or modification may of course be made for the application example of FIG. 13 for the functions (blocks).

Figure 14:
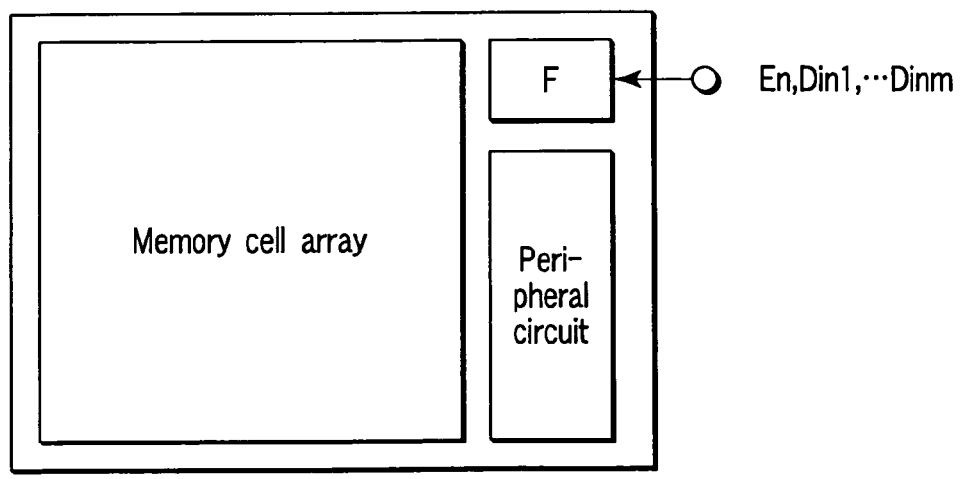
FIG. 14 is view showing an example of a chip layout of a general LSI.

By way of an application example, FIG. 14 depicts an example of a chip layout of a general LSI.

In this case, a chip layout of a general memory is shown by way of the application example. A memory cell array and a peripheral circuit thereof are formed in a memory chip. The fuse circuit according to the each embodiment of the invention is disposed in an arbitrary position of the memory chip. As viewed from the outside of the chip, there exist no differences between the prior-art example and the each embodiment of the invention with respect to signals to be fed to the chip and the control method. This is because, according to the each embodiment of the invention, the data rewrite to the fuse set is implemented without performing dedicated complex control.

The application example has thus been described with reference to the example layout of the general memory. However, the fuse circuit according to the invention as disclosed in the each embodiment may be applied to a different LSI chip, such as a memory embedded logic LSI chip including combinations of memories and logic circuits.

Figure 15:
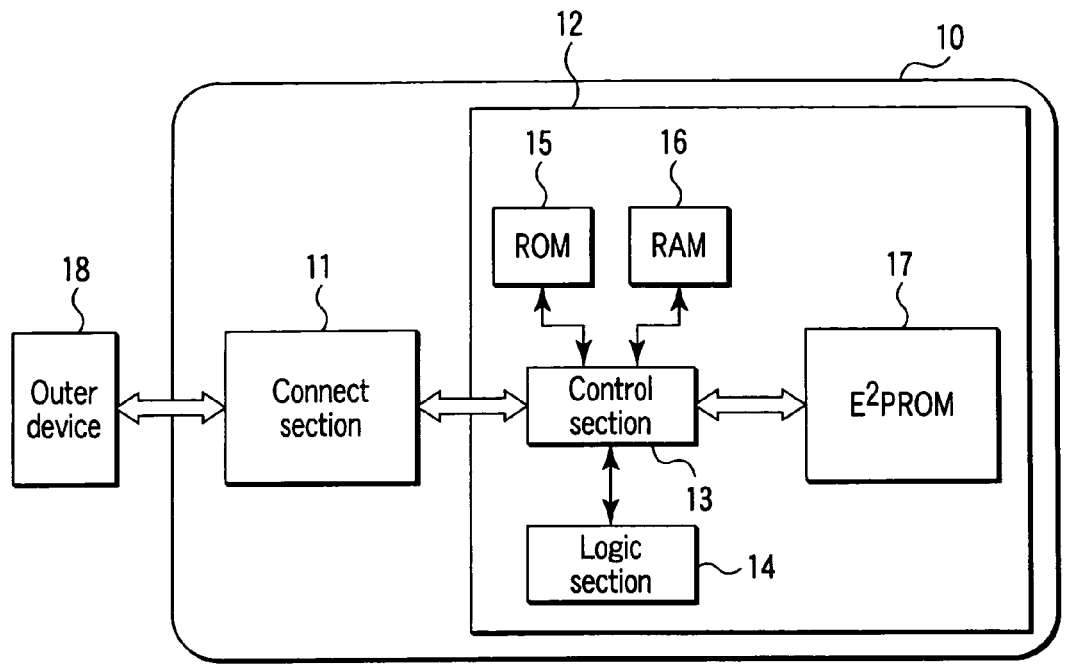
FIG. 15 is a view showing an example of a contact IC card.

FIG. 15 shows a schematic of a contact-type IC card.

A connector section 11 and an IC-card dedicated MPU (microprocessor unit) 12 are mounted over a plastic card 10.

The connector section 11 includes external electrodes, in which the external electrodes are brought in direct contact with an external device 18 (or a reader/writer) to implement data communication. Generally, the IC card is formed in such a manner that the connector section 11 and the IC-card dedicated MPU 12 are modularized into IC modules, and the IC modules are inserted into embossed regions of the plastic card 10.

The IC-card dedicated MPU 12 includes a control circuit, a logic section 14, a ROM 15, and a RAM 16. The ROM 15 contains a data-processing program(s). For the ROM 15, the fuse circuit according to the each embodiment of the invention may be used. The RAM 16 is used to temporarily store data. An EEPROM 17 (electrically erasable programmable read only memory) is used for data preservation.

Figure 16:
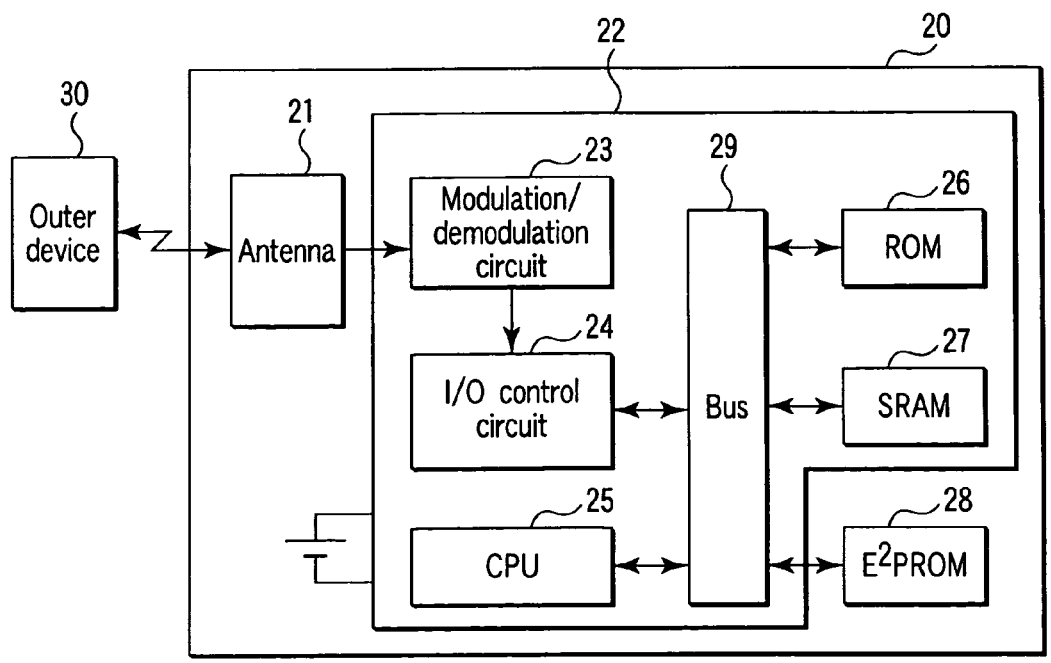
FIG. 16 is a view showing an example of a radio IC card.

FIG. 16 shows a schematic of a radio-type IC card.

An antenna 21 and an IC-card dedicated MPU 22 are built into a plastic card 20. The antenna 21 is used for data communication with an external device 30 (or a reader/writer). The IC-card dedicated MPU 22 includes a modulation/demodulation circuit 23, an I/O (input/output) control circuit 24, a CPU 25, a ROM 26, a RAM 27 (or SRAM (static RAM)), and a bus 29.

A radio frequency (RF) signal received through the antenna 21 is input to the I/O control circuit 24 via the modulation/demodulation circuit 23. The ROM 26 contains a data-processing program(s). The fuse circuit according to the each embodiment of the invention may be used for the ROM 26, for example. The SRAM 27 is used as a temporary data storage device. An EEPROM 28 is also provided for data preservation.

The fuse circuit according to the each embodiment of the invention may be used with a chip mounted into a multi-functional IC card (such as combination-type IC cards) designed such that multiple applications can be processed with a single IC card.

Figure 17:
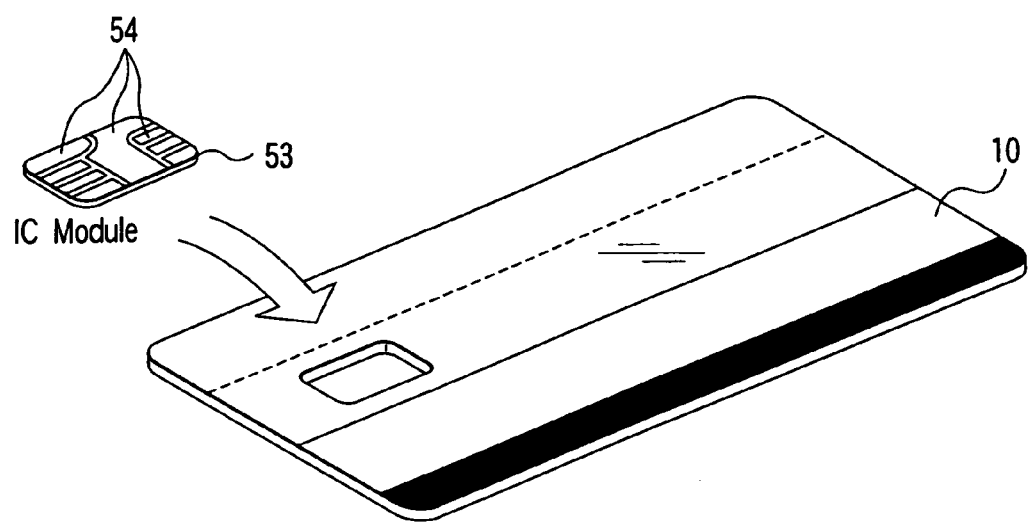
FIG. 17 is a view showing the appearance of an IC card.

FIG. 17 depicts the appearance of an IC card.

A plastic card 10 has a predetermined uniform thickness and has an embossed region provided in a portion of a surface. An IC chip is provided in an IC module 53. External terminals 54 (electrodes) are formed on a surface opposing the surface in which the IC chip of the IC module 53 is mounted. The IC module 53 is inserted into the embossed region in such a manner that the external terminals 54 are barely exposed.

Figure 18:
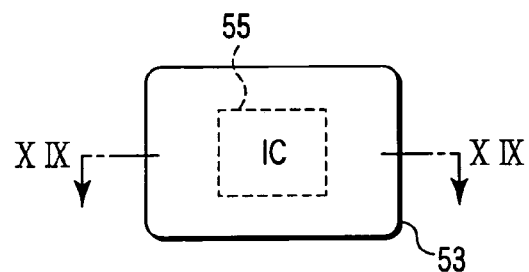
FIG. 18 is a view showing an example of an IC module.
Figure 19:
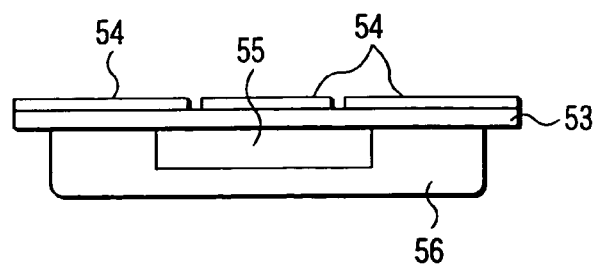
FIG. 19 is a cross-sectional view taken along the line XIX—XIX of FIG. 18.

FIG. 18 depicts the IC module 53. FIG. 19 is a cross-sectional view taken along the line XIX—XIX of FIG. 18. In the FIG. 18, the external terminals are omitted.

An IC (chip) 55 is mounted in one surface side of the IC module 53. The IC 55 is covered by a resin 56. The external electrodes 54 are formed in the other surface side of the IC module 53.

6. Summary

According to the each embodiment of the invention, the fuse circuit can be formed by using standard CMOS processing, and the fuse-data rewrite to one fuse set can be automatically implemented without performing dedicated special control.

The each embodiment of the present invention is designed with a primary concept such that the fuse-data rewrite is performed on the user side after the step of packaging (assembly). However, the each embodiment of the invention may of course be adapted in other instances, for example, when the fuse-data rewrite needs to be performed before the step of packaging.

The fuse circuit according to the each embodiment of the invention is effective when used with a memory embedded logic LSI chip in which a logic circuit (such as an ASIC) and memory circuits (such as a DRAM and a SRAM) are embedded. For example, in such the embedded LSI chip, the fuse circuit according to the each embodiment of the invention can be adapted to program defective addresses (redundancy data) in a memory circuit (redundancy circuit).

The fuse circuit according to the each embodiment of the invention may be adapted not only for the read/programming of defective addresses in a redundancy circuit, but also for programming of various other data, especially, small-size data (such as data in the size of 512 kilobits or smaller).

The fuse circuit according to the each embodiment of the invention can be adapted for the case of programming, for example, circuit-operation related trimming data, chip ID data, security code data, and redundancy data, and data related to the contrast of cellular-phone liquid crystal display.

In the each embodiment of the invention, while the numbers of bits are all set equal for the sub-fuse sets in the individual fuse blocks are all set, the numbers of bits may be set to be different from one another. Alternatively, the numbers of bits may be equally set for the sub-fuse sets in the individual fuse blocks in one fuse set (refer to FIG. 3), and the numbers of programmable bits may be set to be different among different fuse sets.

7. Others

The fuse circuit according to the each embodiment of the invention is effective for use with various types of semiconductor integrated circuits. Especially, the fuse circuit is effective for use with, for example, semiconductor integrated circuits of embedded LSI, system LSI, logic LSI, and memory LSI types in which not only small-size data need to be non-volatilely stored, but also the data need to be rewritten while the number of possible rewrites may be limited to be small.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A fuse circuit comprising blocks, wherein
   each of the blocks comprises a sub-fuse set constituted of fuse elements electrically programmable, and a program control circuit which controls programming of the fuse elements,
   one of the fuse elements is an enable bit representing validity/invalidity of the sub-fuse set, and
   the program control circuit determines a block becoming an object of the programming among the blocks in accordance with a value of the enable bit.

2. The fuse circuit according to claim 1, further comprising a program data latch circuit which latches program data for the block becoming the object of the programming.

3. The fuse circuit according to claim 1, wherein
   the blocks are series connected in n stages (n=plural number), and
   in the block in a first stage, the program control circuit determines whether or not the block in the first block becomes the object of the programming in accordance with the value of the enable bit in the first block.

4. The fuse circuit according to claim 3, wherein when the value of the enable bit in the first block represents the invalidity of the sub-fuse set, the block in the first stage becomes the object of the programming.

5. The fuse circuit according to claim 1, wherein
the blocks are series connected in n stages (n=plural number), and
in the block in an i-th stage ($2 \leq i \leq n$), the program control circuit determines whether or not the block in the i-th stage becomes the object of the programming in accordance with a value of the enable bit in the block in an (i−1)th stage and a value of the enable bit in the block in the i-th stage.

6. The fuse circuit according to claim 5, wherein when the value of the enable bit in the block in the (i−1)th stage represents the validity of the sub-fuse set and when the value of the enable bit in the block in the i-th block represents the invalidity of the sub-fuse set, the block in the i-th stage becomes the object of the programming.

7. The fuse circuit according to claim 1, wherein
each of the blocks has a read control circuit which controls a read of fuse data programmed into each of the fuse elements, and
the read control circuit determines a block becoming an object of the read among the blocks in accordance with a value of the enable bit.

8. The fuse circuit according to claim 7, wherein
the blocks are series connected in n stages (n=plural number), and
in the block in an i-th stage ($1 \leq i \leq n-1$), the read control circuit determines whether or not the block in the i-th stage becomes the object of the read in accordance with a value of the enable bit in the block in the i-th stage and a value of the enable bit in the block in an (i+1)th stage.

9. The fuse circuit according to claim 8, wherein when the value of the enable bit in the block in the i-th block represents the validity of the sub-fuse set and when the value of the enable bit in the block in (i+1)th stage represents the invalidity of the sub-fuse set, the block in the i-th stage becomes the object of the read.

10. The fuse circuit according to claim 7, wherein
the blocks are series connected in n stages (n=plural number), and
in the block in an n-th stage, the read control circuit determines whether or not the block in the n-th stage becomes the object of the read in accordance with a value of the enable bit in the block in the n-th stage.

11. The fuse circuit according to claim 10, wherein when the value of the enable bit in the block in the n-th block represents the validity of the sub-fuse set, the block in the n-th stage is becomes the object of the read.

12. The fuse circuit according to claim 1, wherein each of the blocks has a read data latch circuit which latches fuse data read from the fuse elements.

13. The fuse circuit according to claim 1, wherein
each of the blocks has a read data latch circuit which latches the enable bit read from one of the fuse elements, and
read data latch circuits which latch the remaining fuse data excluding the enable bit are shared by the blocks.

14. The fuse set according to claim 1, wherein each of the fuse elements is an electric fuse element or an anti-fuse element.

15. The fuse element according to claim 1, wherein
the blocks are series connected in n stages (n=plural number), and
the block becoming the object of the programming is determined in the direction from the block in the first block to the block in the n-th block in units of a data rewrite.

16. An integrated circuit having at least one function block comprising a memory which non-volatilely stores data regarding the integrated circuit, wherein
the memory is the fuse circuit according to claim 1, and
the data regarding the integrated circuit is rewritable.

17. A read/program method comprising performing programming for a fuse circuit having sub-fuse sets series connected in n stages, the method comprising:
automatically sequentially changing a sub-fuse set becoming an object of the programming in the direction from the sub-fuse set in the first stage to the sub-fuse set in the n-th stage; and
executing a data rewrite into the object of the programming for the fuse circuit.

18. The read/program method according to claim 17, wherein the sub-fuse set becoming the object of the programming is automatically determined immediately after power on in accordance with a value of an enable bit representing validity/invalidity of the sub-fuse set.

19. The read/program method according to claim 18, wherein the sub-fuse set becoming an object of a fuse-data read is automatically determined immediately after power on in accordance with the value of the enable bit, or, after power on, the enable bit is first latched into a read data latch circuit, and the fuse data in the sub-fuse set is then latched into a read data latch circuit after the sub-fuse set becoming the object of the fuse-data read has been determined.

* * * * *